(12) United States Patent
Tada et al.

(10) Patent No.: US 9,406,877 B2
(45) Date of Patent: Aug. 2, 2016

(54) SEMICONDUCTOR DEVICE AND METHOD OF MANUFACTURING THE SAME

(75) Inventors: Munehiro Tada, Tokyo (JP); Toshitsugu Sakamoto, Tokyo (JP); Hiromitsu Hada, Tokyo (JP); Naoki Banno, Tokyo (JP)

(73) Assignee: NEC CORPORATION, Tokyo (JP)

( * ) Notice: Subject to any disclaimer, the term of this patent is extended or adjusted under 35 U.S.C. 154(b) by 965 days.

(21) Appl. No.: 13/139,602

(22) PCT Filed: Jan. 8, 2010

(86) PCT No.: PCT/JP2010/050122
§ 371 (c)(1),
(2), (4) Date: Jun. 14, 2011

(87) PCT Pub. No.: WO2010/079816
PCT Pub. Date: Jul. 15, 2010

(65) Prior Publication Data
US 2011/0272664 A1    Nov. 10, 2011

(30) Foreign Application Priority Data

Jan. 9, 2009   (JP) .................................. 2009-004038

(51) Int. Cl.
*H01L 45/00*   (2006.01)
*H01L 27/22*   (2006.01)
(Continued)

(52) U.S. Cl.
CPC ............ *H01L 45/085* (2013.01); *H01L 27/228* (2013.01); *H01L 27/2436* (2013.01); *H01L 45/04* (2013.01); *H01L 45/1233* (2013.01);
(Continued)

(58) Field of Classification Search
CPC . H01L 45/00; H01L 45/1625; H01L 45/1675; H01L 27/101
USPC .............................................................. 257/4
See application file for complete search history.

(56) References Cited

U.S. PATENT DOCUMENTS

| | | | | |
|---|---|---|---|---|
| 2004/0085833 A1* | 5/2004 | Hwang | ............... | G11C 13/0004 365/200 |
| 2008/0061341 A1* | 3/2008 | Lung | .................. | G11C 11/5678 257/303 |

(Continued)

FOREIGN PATENT DOCUMENTS

| | | |
|---|---|---|
| JP | 2006319028 A | 11/2006 |
| JP | 2008244090 A | 10/2008 |

(Continued)

OTHER PUBLICATIONS

International Search Report for PCT/JP2010/050122 mailed Apr. 13, 2010.

(Continued)

*Primary Examiner* — Tran Tran

(57) ABSTRACT

A semiconductor device comprises a semiconductor substrate; a multilevel wiring layer structure on the semiconductor substrate; and a variable resistance element in the multilevel wiring layer structure, wherein the variable resistance element comprises a variable resistance element film whose resistance changes between a top electrode and a bottom electrode, wherein the multilevel wiring layer structure comprises at least a wiring electrically connected to the bottom electrode and a plug electrically connected to the top electrode, and wherein the wiring also serves as the bottom electrode.

26 Claims, 17 Drawing Sheets

(51) Int. Cl.
*H01L 27/24* (2006.01)
*H01L 27/10* (2006.01)

(52) U.S. Cl.
CPC .......... *H01L 45/146* (2013.01); *H01L 45/1625* (2013.01); *H01L 45/1675* (2013.01); *H01L 27/101* (2013.01)

(56) References Cited

U.S. PATENT DOCUMENTS

| | | | | |
|---|---|---|---|---|
| 2008/0117664 | A1* | 5/2008 | Kinoshita | G11C 13/0007 365/148 |
| 2008/0277644 | A1* | 11/2008 | Chen | H01L 27/2436 257/5 |
| 2009/0184305 | A1* | 7/2009 | Lee | G11C 13/0007 257/2 |
| 2010/0038784 | A1* | 2/2010 | Edelstein | H01L 21/76846 257/751 |

FOREIGN PATENT DOCUMENTS

| | | |
|---|---|---|
| WO | 2007091532 A | 8/2007 |
| WO | 2008001712 A | 1/2008 |
| WO | 2008047711 A | 4/2008 |
| WO | 2008149605 A | 12/2008 |

OTHER PUBLICATIONS

S. Kaeriyama et al., "A Nonvolatile Programmable Solid-Electrolyte Nanometer Switch", IEEE Journal of Solid-State Circuits, vol. 40, No. 1, Jan. 2005, pp. 168-176.

M. N. Kozicki et al., "Nanoscale Memory Elements Based on Solid-State Electrolytes", IEEE Transactions on Nanotechnology, vol. 4, No. 3, May 2005, pp. 331-338.

T. Sakamoto et al., "A Ta2O5 solid-electrolyte switch with improved reliability", 2007 Symposium on VLSI Technology Digest of Technical papers, 2007, pp. 38-39.

* cited by examiner

SEMICONDUCTOR DEVICE AND METHOD OF MANUFACTURING THE SAME

The present application is the National Phase of PCT/JP2010/050122, filed Jan. 8, 2010, which is based upon and claims the benefit of the priority of Japanese patent application No. 2009-004038, filed on Jan. 9, 2009, the disclosure of which is incorporated herein in its entirety by reference thereto.

TECHNICAL FIELD

The present invention relates to a semiconductor device and a method of manufacturing the semiconductor device. In particular, it relates to a semiconductor device including a field programmable gate array (FPGA) having a variable-resistance-type nonvolatile element (hereinafter, a variable resistance element) in a multilevel wiring layer structure and to a method of manufacturing the semiconductor device.

BACKGROUND

With miniaturization (scaling law: Moore's law) of semiconductor devices (particularly, silicon devices), device integration and power reduction have advanced at a rate of four times in three years. In recent years, gate lengths of MOSFETs (Metal Oxide Semiconductor Field Effect Transistors) have been decreased to 20 nm or less. In addition, because of rising costs of the lithography process (costs for devices and mask sets) and of physical limits (operation limit/variation limit) of the device size, improvement in device performance demands an approach different from conventional approaches based on the scaling law.

In recent years, a rewritable programmable logic device referred to as FPGA has been developed as a device positioned between a gate array and a standard cell. With the FPGA, customers can design an arbitrary circuit configuration after the chip is manufactured. The FPGA includes a variable resistance element in a multilevel wiring layer structure, and customers can make electrical connection of wirings arbitrarily. By using a semiconductor device including such FPGA, circuit freedom can be improved. Examples of the variable resistance element include a ReRAM (Resistance Random Access Memory) using a transition metal oxide and NanoBridge (registered trademark of NEC Corporation) using an ion conductor.

As a variable resistance element that is likely to satisfy relevant requirements, Non-Patent Document 1 discloses a switching element using metal ion movement and electrochemical reaction in an ion conductor (solid substance in which ions can move freely when an electric field is applied). This switching element disclosed in Non-Patent Document 1 includes three layers of an ion conducting layer and first and second electrodes that are in contact with the ion conducting layer and are arranged on opposing surfaces. The first electrode serves to supply metal ions to the ion conducting layer. Metal ions are not supplied from the second electrode.

An operation of this switching element will be described briefly. When the first electrode is connected to ground and a negative voltage is applied to the second electrode, metal of the first electrode is dissolved in the ion conducting layer as metal ions. The metal ions in the ion conducting layer are precipitated as metal, and the precipitated metal forms a metal bridge connecting the first and second electrodes. Since the first and second electrodes are electrically connected by the metal bridge, the switch is brought in an on-state. On the other hand, in the above on-state, if the first electrode is connected to ground and a positive voltage is applied to the second electrode, part of the metal bridge is cut off. As a result, the electrical connection between the first and second electrodes is cut off, and the switch is brought in an off-state. Before the electrical connection is completely cut off, electric characteristics are changed. For example, the resistance between the first and second electrodes is increased or the capacitance between the electrodes is varied. After such electric characteristics are changed, the electrical connection is finally cut off. If the first electrode is connected to ground and a negative voltage is applied to the second electrode again, the switch is brought from the off-state to the on-state.

Non-Patent Document 1 discloses a configuration and operation of a 2-terminal-type switching element that includes two electrodes sandwiching an ion conductor and controls the conduction state between the two electrodes. Further, Non-Patent Document 1 proposes a 3-terminal-type switching element that includes, in addition to the above electrodes, a single control electrode (third electrode). According to this document, by applying a voltage to the control electrode, the conductive state of the ion conductor between the first and second electrodes is controlled.

Such switching element is smaller in size and on-resistance, compared with conventionally-used semiconductor switches (MOSFETs and the like). Thus, the switching element is considered to be a promising technique to be applied to programmable logic devices. Further, based on this switching element, even after the applied voltage is turned off, the conduction state (on or off) is maintained. Thus, the switching element can be also considered as a nonvolatile memory element. For example, by arranging a plurality of memory cells, each of which includes a single selection element such as a transistor and a single switching element as a basic unit, in vertical and horizontal directions and by using word and bit lines, an arbitrary memory cell can be selected from among the plurality of memory cells. Thus, a nonvolatile memory that can sense the conduction state of the switching element of the selected memory cell and can read whether information 1 or 0 is stored based on the on-state/off-state of the switching element can be realized.

Non-Patent Document 1: Shunichi Kaeriyama et al., "A Nonvolatile Programmable Solid-Electrolyte Nanometer Switch", IEEE Journal of Solid-State Circuits, Vol. 40, No. 1, pp. 168-176, January 2005.

SUMMARY

The entire disclosures of the above Non-Patent Document is incorporated herein by reference thereto. The following analyses are given by the present invention. To respond to recent demands for higher integration, the need for increasing the density with smaller variable resistance elements and the need for reducing the number of processing steps are increasing. In addition, the need for improving the performance (lower resistance) and reliability of variable resistance elements is increasing. Thus, a variable resistance element having a configuration that enables higher integration, higher performance, and higher reliability and a method of forming such variable resistance element are being demanded. While most-advanced devices include copper wirings, also in order to improve flexibility of the circuit performance by mounting a variable resistance element on such a most-advanced device, a method of forming a variable resistance element in a copper wiring is being demanded.

However, to satisfy the above requirements, conventional techniques have the following problems. First, no conventional techniques can realize arrangement of a switching element in a multilayer copper wiring of a ULSI (Ultra-Large Scale Integration) with high reliability and high density. Second, if a variable resistance element is formed on a copper wiring, an uneven portion formed at the periphery of the connection portion between the copper wiring and the variable resistance element causes electric field concentration, thereby deteriorating the insulating properties. Third, if a copper plug is connected on the uneven portion formed at the periphery, there is a high possibility that a void is caused at the bottom of the copper plug, thereby deteriorating the yield.

It is a primary object of the present invention to provide: a semiconductor device including a variable resistance element capable of increasing the reliability and the density and preventing deterioration of the insulating properties and the yield; and a method of manufacturing the semiconductor device.

According to a first aspect of the present invention, there is provided a semiconductor device comprising: a semiconductor substrate; a multilevel wiring layer structure on the semiconductor substrate; and a variable resistance element in the multilevel wiring layer structure, wherein the variable resistance element comprises a variable resistance element film whose resistance changes between a top electrode and a bottom electrode, wherein the multilevel wiring layer structure comprises at least a wiring electrically connected to the bottom electrode and a plug electrically connected to the top electrode, and wherein the wiring also serves as the bottom electrode.

According to a second aspect of the present invention, there is provided a method of manufacturing a semiconductor device comprising a variable resistance element in a multilevel wiring layer structure on a semiconductor substrate. The method comprises the steps of: forming a variable resistance element film and a top electrode in this order on a wiring; and forming a plug on the top electrode.

According to the present invention, since the wiring is used as the bottom electrode of the variable resistance element, that is, since the wiring also serves as the bottom electrode of the variable resistance element, the size of the variable resistance element is reduced and the density of the variable resistance element is increased. In addition, the number of processing steps can be reduced. By forming a 2PR mask set as an additional step in addition to a normal Cu damascene wiring step, a variable resistance element 22 can be mounted. At the same time, costs of the device can be reduced. Further, since the wall surface of the opening in the insulating barrier film is formed to have a taper angle of 85 degrees or less, electric field concentration at the periphery of the connection portion between the wiring and the variable resistance element film (around the periphery of the opening in the insulating barrier film) is reduced. Thus, the insulation resistance can be improved. Furthermore, since the variable resistance element 22 can also be mounted in a most-advanced device comprising copper wirings, performance of the device can be improved.

PREFERRED MODES

Figure 1:
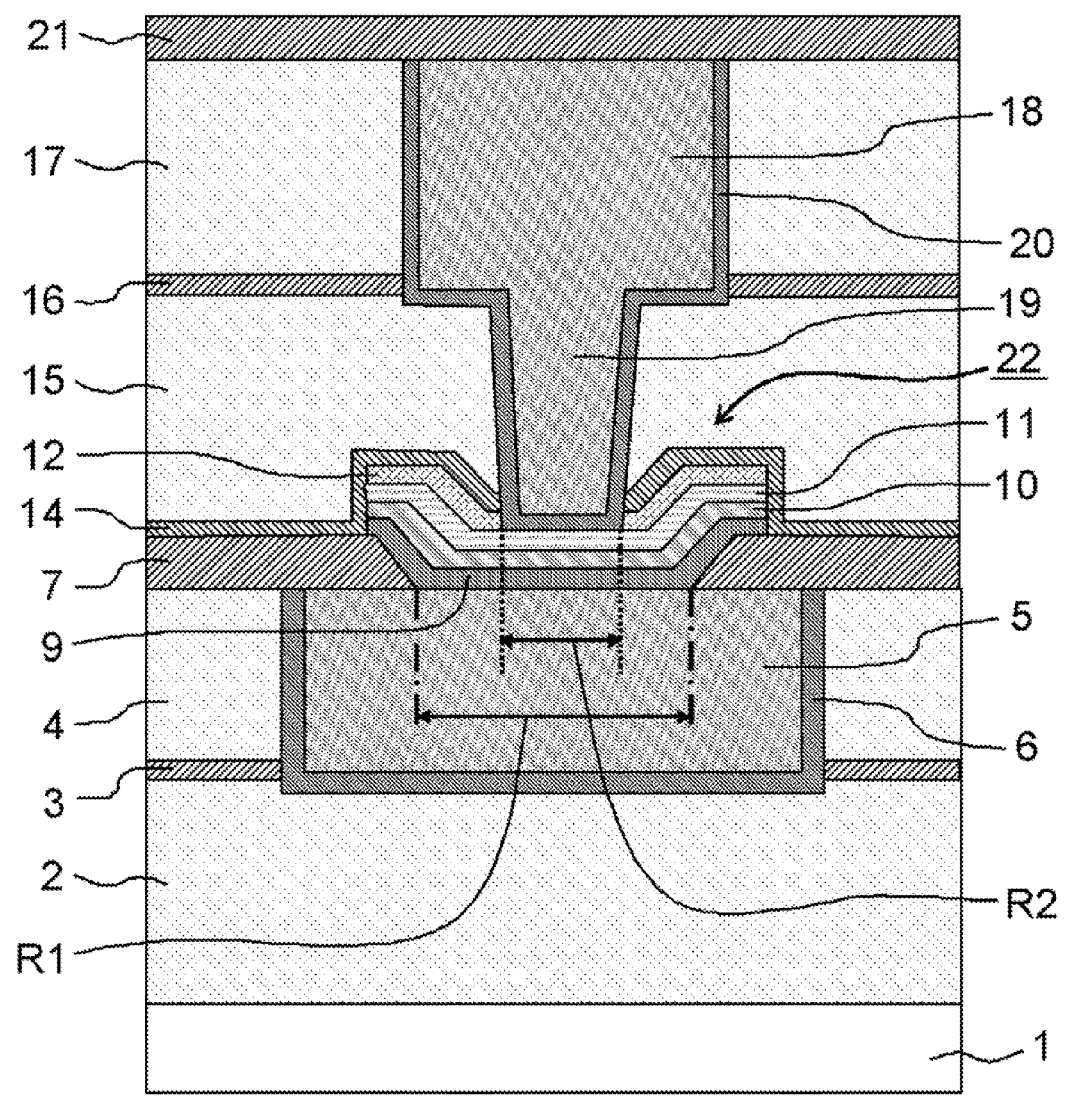
FIG. 1 is a partial cross-sectional view schematically illustrating a configuration of a semiconductor device according to example 1 of the present invention.

A semiconductor device according to exemplary embodiment 1 of the present invention comprises: a semiconductor substrate (1 in FIG. 1); a multilevel wiring layer structure (2-7 and 15-21 in FIG. 1) on the semiconductor substrate (1 in FIG. 1); and a variable resistance element (22 in FIG. 1) in the multilevel wiring layer structure (2-7 and 15-21 in FIG. 1), wherein the variable resistance element (22 in FIG. 1) comprises a variable resistance element film (9 in FIG. 1) whose resistance changes between a top electrode (10, 11 in FIG. 1) and a bottom electrode (5 in FIG. 1), wherein the multilevel wiring layer structure (2-7 and 15-21 in FIG. 1) comprises at least a wiring (5 in FIG. 1) electrically connected to the bottom electrode (5 in FIG. 1) and a plug (19 in FIG. 1)

electrically connected to the top electrode (10, 11 in FIG. 1), and wherein the wiring (5 in FIG. 1) also serves as the bottom electrode (5 in FIG. 1).

Based on the semiconductor device of the present invention, it is preferable that the variable resistance element film have a bottom surface at a periphery of a connection portion between the wiring and the variable resistance element film and that the bottom surface be set at an angle of 85 degrees or less with respect to a top surface of the wiring.

Based on the semiconductor device of the present invention, it is preferable that an insulating barrier film be arranged between the bottom electrode and the variable resistance element film, that the insulating barrier film have an opening, and that the variable resistance element film be in contact with the bottom electrode in the opening. In addition, it is preferable that the opening have a tapered wall surface and have a wider diameter at a portion farther from the wiring, that the tapered surface be set at an angle of 85 degrees or less with respect to a top surface of the wiring, and that the variable resistance element film be arranged so that a periphery of a connection portion between the wiring and the variable resistance element film is at least arranged on the tapered surface.

Based on the semiconductor device of the present invention, it is preferable that an area of a region where the plug and the top electrode are connected be smaller than an area of a region where the variable resistance element film and the wiring are connected.

Based on the semiconductor device of the present invention, it is preferable that a region where the plug and the top electrode are connected be arranged in a region different from a region where the variable resistance element film and the wiring are connected Based on the semiconductor device of the present invention, it is preferable that the wiring be in contact with the variable resistance element film.

Based on the semiconductor device of the present invention, it is preferable that the wiring be made of copper.

Based on the semiconductor device of the present invention, it is preferable that the wiring be alloyed with Al or that a surface of the wiring be converted into silicide or nitride.

Based on the semiconductor device of the present invention, it is preferable that the variable resistance element film be an oxide including Ta or TaSi.

Based on the semiconductor device of the present invention, it is preferable that the variable resistance element film have a laminate structure in which $Ta_2O_5$ and TaSiO are stacked in this order from bottom to top.

Based on the semiconductor device of the present invention, it is preferable that the top electrode have a structure in which a first top electrode and a second top electrode are stacked in this order on the variable resistance element film, that the first top electrode comprise a metal material having a smaller absolute value in oxidation free energy than that of a metal component of the variable resistance element film, and that the second top electrode be in contact with the plug.

Based on the semiconductor device of the present invention, it is preferable that the first top electrode be made of Pt, Ru, or oxide thereof.

Based on the semiconductor device of the present invention, it is preferable that the second top electrode be made of Ti, Ta, W, or nitride thereof.

Based on the semiconductor device of the present invention, it is preferable that the semiconductor device comprise a second bottom electrode arranged between the wiring and the variable resistance element film and having diffusion barrier properties for a metal of the wiring.

Based on the semiconductor device of the present invention, it is preferable that the second bottom electrode be an electrode having a laminate structure of two layers and that one of the layers that is on the variable resistance element film be made of a material identical to that of the first top electrode.

Based on the semiconductor device of the present invention, it is preferable that the second bottom electrode be an electrode in which TaN and Ru are stacked in this order on the wiring.

Based on the semiconductor device of the present invention, it is preferable that the semiconductor device comprise a second variable resistance element film arranged between the variable resistance element film and the top electrode and made of a metal oxide having a larger absolute value in oxidation free energy than that of a metal component of the variable resistance element film.

Based on the semiconductor device of the present invention, it is preferable that the second variable resistance element film be made of oxide of Ti or Ni.

Based on the semiconductor device of the present invention, it is preferable that a hard mask film be arranged on the top electrode and that a multilayer (laminate) body of the hard mask film, the top electrode, and the variable resistance element film have top and side surfaces covered by a protective insulating film. In addition, it is preferable that the protective insulating film be in contact with the insulating barrier film at a periphery of the multilayer (laminate) body of the hard mask film, the top electrode, and the variable resistance element film and that the plug extend in a prepared hole formed in the protective insulating film and the hard mask film and be electrically connected to the top electrode.

Based on the semiconductor device of the present invention, it is preferable that a hard mask film be arranged on the top electrode and that a second hard mask film made of a material different from that of the hard mask film be arranged on the hard mask film. In addition, it is preferable that a multilayer (laminate) body of the second hard mask film, the hard mask film, the top electrode, and the variable resistance element film have a side surface covered by a protective insulating film and that the protective insulating film be in contact with the insulating barrier film at a periphery of the multilayer (laminate) body of the second hard mask film, the hard mask film, the top electrode, and the variable resistance element film. In addition, it is preferable that the plug extend in a prepared hole formed in the second hard mask film and the hard mask film and be electrically connected to the top electrode.

Based on the semiconductor device of the present invention, it is preferable that a multilayer (laminate) body of the second hard mask film, the hard mask film, the top electrode, and the variable resistance element film have top and side surfaces covered by a protective insulating film and that the protective insulating film be in contact with the insulating barrier film at a periphery of the multilayer (laminate) body of the second hard mask film, the hard mask film, the top electrode, and the variable resistance element film. In addition, it is preferable that the plug extend in a prepared hole formed in the protective insulating film, the second hard mask film, and the hard mask film and be electrically connected to the top electrode via a barrier metal.

Based on the semiconductor device of the present invention, it is preferable that the protective insulating film be made of a material identical to that of the hard mask film and the insulating barrier film.

Based on the semiconductor device of the present invention, it is preferable that the semiconductor device comprise a second variable resistance element that is formed in a layer identical to or different from that of the variable resistance element in the multilevel wiring layer structure and that comprises a variable resistance element film whose resistance changes between a top electrode and a bottom electrode.

Based on the semiconductor device of the present invention, it is preferable that the multilevel wiring layer structure comprise at least a second wiring electrically connected to the bottom electrode of the second variable resistance element and a second plug electrically connected to the top electrode of the second variable resistance element and that the second wiring also serve as the bottom electrode of the second variable resistance element.

Based on the semiconductor device of the present invention, it is preferable that the second wiring be integrated with the plug.

Based on the semiconductor device of the present invention, it is preferable that the variable resistance element film be made of oxide containing Ni.

Based on the semiconductor device of the present invention, it is preferable that the top electrode have a structure in which a first top electrode and a second top electrode are stacked in this order on the variable resistance element film, that the first top electrode be made of Ru, and that the second bottom electrode be an electrode in which TaN and Ru are stacked in this order on the wiring.

A method of manufacturing a semiconductor device comprising a variable resistance element in a multilevel wiring layer structure on a semiconductor substrate according to exemplary embodiment 2 of the present invention comprises the steps of: forming a variable resistance element film and a top electrode in this order on a wiring (FIGS. 3C and 4A); and forming a plug on the top electrode (FIG. 1).

Based on the method of manufacturing the semiconductor device of the present invention, it is preferable that the method comprise, prior to the step of forming the variable resistance element film and the top electrode, the steps of: forming an insulating barrier film on the wiring; forming a hard mask having an opening pattern on the insulating barrier film; using the hard mask as a mask and carrying out reactive dry etching on the insulating barrier film exposed in the opening pattern to form an opening in the insulating barrier film, the opening extending to the wiring, having a tapered wall surface, and having a wider diameter at a portion farther from the wiring; and using an inactive gas and carrying RF etching to adjust the tapered surface of the opening to a desired angle. In addition, it is preferable that, in the step of forming the variable resistance element film and the top electrode, the variable resistance element film be formed also on the tapered surface.

Based on the method of manufacturing the semiconductor device of the present invention, it is preferable that the hard mask have a multilayer (laminate) structure in which SiN and $SiO_2$ are stacked in this order on the insulating barrier film.

Based on the method of manufacturing the semiconductor device of the present invention, it is preferable that a gas containing fluorocarbon be used as etching gas in the reactive dry etching.

Based on the method of manufacturing the semiconductor device of the present invention, it is preferable that the inactive gas be He or Ar.

Based on the method of manufacturing the semiconductor device of the present invention, it is preferable that the method comprise a process of emitting $SiH_4$ gas to the wiring, prior to the step of forming the variable resistance element film and the top electrode.

Based on the method of manufacturing the semiconductor device of the present invention, it is preferable that a plasma treatment be carried out on the wiring by using $NH_3$ or $N_2$ gas, prior to the step of forming the variable resistance element film and the top electrode.

Based on the method of manufacturing the semiconductor device of the present invention, it is preferable that, in the step of forming the variable resistance element film and the top electrode, a second bottom electrode, the variable resistance element film, a second variable resistance element film, and the top electrode be formed in this order on a bottom electrode, that the second bottom electrode have diffusion barrier properties for a metal of the bottom electrode, and that the second variable resistance element film be made of a metal oxide having a larger absolute value in oxidation free energy than that of a metal component of the variable resistance element film.

Based on the method of manufacturing the semiconductor device of the present invention, it is preferable that, in the step of forming the variable resistance element film and the top electrode, the variable resistance element film, the top electrode, and a hard mask film be formed in this order on the bottom electrode in the opening, that the method comprise, after the step of forming the variable resistance element film and the top electrode and before the step of forming the plug, the steps of forming a protective insulating film on the insulating barrier film including a multilayer (laminate) body of the hard mask film, the top electrode, and the variable resistance element film and forming a prepared hole extending to the top electrode in the protective insulating film and the hard mask film, and that a second hard mask film be made of a material different from the hard mask film.

Based on the method of manufacturing the semiconductor device of the present invention, it is preferable that, in the step of forming the variable resistance element film and the top electrode, the variable resistance element film, the top electrode, a hard mask film, and a second hard mask film be formed in this order on the bottom electrode in the opening, that the method comprise, after the step of forming the variable resistance element film and the top electrode and before the step of forming a barrier metal, the steps of forming a protective insulating film on the insulating barrier film including a multilayer (laminate) body of the second hard mask film, the hard mask film, the top electrode, and the variable resistance element film and forming a prepared hole extending to the top electrode in the protective insulating film, the second hard mask film and the hard mask film, and that the second hard mask film be made of a material different from that of the hard mask film.

Based on the method of manufacturing the semiconductor device of the present invention, it is preferable that, in the step of forming the variable resistance element film and the top electrode, the variable resistance element film, the top electrode, a hard mask film, and a second hard mask film be formed in this order on the bottom electrode in the opening, that the method comprise, after the step of forming the variable resistance element film and the top electrode and before the step of forming a barrier metal, the steps of forming a protective insulating film on the insulating barrier film including a multilayer (laminate) body of the second hard mask film, the hard mask film, the top electrode, and the variable resistance element film, polishing the protective insulating film and the second hard mask film for planarization until the second hard mask film assumes a predetermined thickness, and forming a prepared hole extending to the top electrode in the second hard mask film and the hard mask film, and that the second hard mask film be made of a material different from that of the hard mask film.

Based on the method of manufacturing the semiconductor device of the present invention, it is preferable that the protective insulating film be made of a material identical to that of the hard mask film and the insulating barrier film.

Based on the method of manufacturing the semiconductor device of the present invention, it is preferable that, in the step of forming the wiring, other wirings that do not serve as the bottom electrode of the variable resistance element film be simultaneously formed and that, in the step of forming the plug, other plugs be formed on the other wirings.

In the following examples will be disclosed with reference to the drawings for better illustration but not limitative intention.

Example 1

A semiconductor device according to example 1 of the present invention will be described with reference to the drawings. FIG. 1 is a partial cross-sectional view schematically illustrating a configuration of the semiconductor device according to example 1 of the present invention.

The semiconductor device according to example 1 includes a variable resistance element 22 in a multilevel wiring layer structure on a semiconductor substrate 1.

The multilevel wiring layer structure has an insulating multilayer (laminate) body formed by stacking an interlayer insulating film 2, a barrier insulating film 3, an interlayer insulating film 4, an insulating barrier film 7, a protective insulating film 14, an interlayer insulating film 15, an etching stopper film 16, an interlayer insulating film 17, and a barrier insulating film 21 in this order on the semiconductor substrate 1. In the multilevel wiring layer structure, a first wiring 5 is embedded in a wiring trench formed in the interlayer insulating film 4 and the barrier insulating film 3 via a barrier metal 6. In the multilevel wiring layer structure, a second wiring 18 is embedded in a wiring trench formed in the interlayer insulating film 17 and the etching stopper film 16. A plug 19 is embedded in a prepared hole formed in the interlayer insulating film 15, the protective insulating film 14, and a hard mask film 12. The second wiring 18 and the plug 19 are integrally formed, and side and bottom surfaces of the second wiring and the plug 19 are covered by a barrier metal 20.

In the multilevel wiring layer structure, the first wiring 5 serving as a bottom electrode is formed at an opening formed in the insulating barrier film 7, and the variable resistance element 22 formed by stacking a variable resistance element film 9, a first top electrode 10, and a second top electrode 11 in this order is formed on the side surface of the opening in the insulating barrier film 7 and on the insulating barrier film 7. The hard mask film 12 is formed on the second top electrode 11, and a multilayer (laminate) body of the variable resistance element film 9, the first top electrode 10, the second top electrode 11, and the hard mask film 12 have top and side surfaces covered by the protective insulating film 14. Since the first wiring 5 is used as a bottom electrode of the variable resistance element 22, namely, since the first wiring 5 also serves as a bottom electrode of the variable resistance element 22, the number of processing steps can be simplified and the electrode resistance can be reduced. By forming at least a 2PR mask set as an additional step in addition to a normal Cu damascene wiring step, the variable resistance element can be mounted. As a result, reduction in both the resistance and the cost of the element can be achieved.

The variable resistance element 22 is a variable-resistance-type nonvolatile element and can be formed as a switching element using metal ion movement and electrochemical reaction in an ion conductor, for example. The variable resistance element 22 includes the variable resistance element film 9 arranged between the first wiring 5 serving as a bottom electrode and the top electrodes 10 and electrically connected to the plug 19. Based on the variable resistance element 22, the variable resistance element film 9 and the first wiring 5 are in direct contact with each other at the opening formed in the insulating barrier film 7, and the plug 19 and the second top electrode 11 are electrically connected to each other via the barrier metal 20 on the second top electrode 11. The on/off control of the variable resistance element 22 is executed by application of a voltage or a current. For example, by using an electric field diffusion of metal of the first wiring 5 into the variable resistance element film 9, the on/off control is executed. The second top electrode 11 and the barrier metal 20 are made of an identical material. In this way, since the barrier metal 20 of the plug 19 is integrated with the second top electrode 11 of the variable resistance element 22, the contact resistance can be reduced. In addition, improvement in adherence can realize improvement in reliability.

Semiconductor elements are formed on the semiconductor substrate 1. For example, a silicon substrate, a single-crystal substrate, an SOI (Silicon on Insulator) substrate, a TFT (Thin Film Transistor) substrate, or a liquid crystal manufacture substrate can be used as the semiconductor substrate 1.

The interlayer insulating film 2 is formed on the semiconductor substrate 1. For example, a silicon oxide film or a low-dielectric-constant film (SiOCH film, for example) having a relative dielectric constant lower than that of a silicon oxide film can be used as the interlayer insulating film 2. The interlayer insulating film 2 may be formed by stacking a plurality of insulating films.

The barrier insulating film 3 is arranged between the interlayer insulating films 2 and 4 and has barrier properties. The barrier insulating film 3 serves as an etching stop layer when a wiring trench for the first wiring 5 is processed. For example, a SiN film, a SiC film, a SiCN film, or the like can be used as the barrier insulating film 3. In the barrier insulating film 3, a wiring trench for embedding the first wiring 5 is formed. The first wiring 5 is embedded in the wiring trench via the barrier metal 6. The barrier insulating film 3 may be deleted, depending on selection of etching conditions of the wiring trench.

The interlayer insulating film 4 is formed on the barrier insulating film 3. For example, a silicon oxide film or a low-dielectric-constant film (SiOCH film, for example) having a relative dielectric constant lower than that of a silicon oxide film can be used as the interlayer insulating film 4. The interlayer insulating film 4 may be formed by stacking a plurality of insulating films. In the barrier insulating film 4, a wiring trench for embedding the first wiring 5 is formed. The first wiring 5 is embedded in the wiring trench via the barrier metal 6.

The first wiring 5 is embedded in the wiring trench formed in the interlayer insulating film 4 and the barrier insulating film 3 via the barrier metal 6. The first wiring 5 also serves as a bottom electrode of the variable resistance element 22 and is in direct contact with the variable resistance element film 9. An electrode layer or the like may be inserted between the first wiring 5 and the variable resistance element film 9. When an electrode layer is formed, the electrode layer and the variable resistance element film 9 are deposited in continuous processes and processed in continuous processes. The bottom portion of the variable resistance element film 9 is not connected to a lower-layer wiring via a contact plug. The first wiring 5 is made of a metal that enables diffusion or ion conduction in the variable resistance element film 9. For example, Cu or the like can be used. The first wiring 5 may be alloyed with Al or converted into silicide or nitride. A surface of the first wiring 5 may be converted into silicide or nitride.

The barrier metal 6 is a conductive film having barrier properties. The barrier metal 6 covers the side and bottom surfaces of the wiring, to prevent the metal of the first wiring 5 from diffusing into the interlayer insulating film 4 and lower layers. For example, if the first wiring 5 is made of metal elements including Cu as a primary component, a high-melting-point metal such as tantalum (Ta), tantalum nitride (TaN), titanium nitride (TiN), or tungsten carbonitride (WCN), nitride of such metal, or layers of such films can be used as the barrier metal 6.

The insulating barrier film 7 is formed on the interlayer insulating film 4 including the first wiring 5 and serves to prevent oxidation of the metal (for example, Cu) of the first wiring 5 and diffusion of the metal of the first wiring 5 into the interlayer insulating film 15. In addition, the insulating barrier film 7 serves as an etching stop layer when the top electrodes 11 and 10 and the variable resistance element film 9 are processed. For example, a SiC film, a SiCN film, a SiN film, or a multilayer (laminate) structure of such films can be used as the insulating barrier film 7. It is preferable that the insulating barrier film 7 be made of a material identical to that of the protective insulating film 14 and the hard mask film 12.

The insulating barrier film 7 has an opening on the first wiring 5. The first wiring 5 and the variable resistance element film 9 are in contact with each other at the opening in the insulating barrier film 7. The opening in the insulating barrier film 7 is formed within an area of the first wiring 5. In this way, the variable resistance element 22 can be formed on a surface of the first wiring 5 having a small irregularity. The wall surface of the opening in the insulating barrier film 7 is a tapered surface. The opening has a wider diameter at a portion farther from the first wiring 5. The tapered surface of the opening in the insulating barrier film 7 is set at 85 degrees or less with respect to the top surface of the first wiring 5. In this way, electric field concentration at the periphery of the connection portion between the first wiring 5 and the variable resistance element film 9 (around the periphery of the opening in the insulating barrier film 7) is reduced. Thus, the insulation resistance can be improved.

The variable resistance element film 9 is a film whose resistance changes. An arbitrary material can be used as the variable resistance element film 9, as long as the resistance thereof changes depending on actions (diffusion, ion transmission, etc.) of the metal of the first wiring 5 (bottom electrode). If the resistance of the variable resistance element 22 is changed by precipitation of metal ions, a film that enables ion conduction is used. For example, an oxide insulating film including Ta, such as $Ta_2O_5$ or TaSiO, may be used. Alternatively, the variable resistance element film 9 may have a multilayer (laminate) structure in which $Ta_2O_5$ (lower layer) and TaSiO (upper layer) are stacked in this order from bottom to top. By forming such multilayer (laminate) structure, when the variable resistance element film 9 is used as an ion conducting layer, a bridge of metal ions (copper ions, for example) formed in the ion conducting layer during a low resistance (ON) can be cut off by the $Ta_2O_5$ layer. Thus, since the metal ions can be easily collected during OFF, the switching characteristics can be improved. The variable resistance element film 9 is formed on the first wiring 5, on the tapered surface of the opening of the insulating barrier film 7, and on the insulating barrier film 7. Regarding the variable resistance element film 9, the periphery of the connection portion between the first wiring 5 and the variable resistance element film 9 is arranged at least along the tapered surface of the opening in the insulating barrier film 7. The bottom surface of the periphery of the connection portion between the first wiring 5 and the variable resistance element film 9 is set at an angle of 85 degrees or less with respect to the top surface of the first wiring 5.

The first top electrode 10 is an electrode disposed at a lower side of the top electrodes of the variable resistance element 22 and is in direct contact with the variable resistance element film 9. It is preferable that the first top electrode 10 be made of a metal that is not easily ionized and that does not easily enable diffusion or ion conduction in the variable resistance element film 9, as compared with the metal of the first wiring 5. In addition, it is preferable that the first top electrode 10 be made of a metal material having a smaller absolute value in oxidation free energy than that of the metal component (Ta) of the variable resistance element film 9. For example, Pt, Ru, or the like can be used as the first top electrode 10. Alternatively, oxygen may be added to the first top electrode 10 including a metal material such as Pt or Ru as a primary component. Alternatively, the first top electrode 10 may have a multilayer (laminate) structure including a layer in which oxygen is added.

The second top electrode 11 is an upper one of the top electrodes of the variable resistance element 22 and is formed on the first top electrode 10. The second top electrode 11 serves to protect the first top electrode 10. Namely, since the second top electrode 11 protects the first top electrode 10, damage to the first top electrode 10 during processing can be suppressed. Consequently, switching characteristics of the variable resistance element 22 can be maintained. For example, Ta, Ti, W, or a nitride thereof can be used as the second top electrode 11. It is preferable that the second top electrode 11 be made of a material identical to that of the barrier metal 20. The second top electrode 11 is electrically connected to the plug 19 via the barrier metal 20. A diameter R2 (or the area) of the region where the second top electrode 11 and the plug 19 (the barrier metal 20 to be exact) are in contact with each other is set to be smaller than a diameter R1 (or the area) of the region where the first wiring 5 and the variable resistance element film 9 are in contact with each other. In this way, defects of embedment of a plate (a copper plate, for example) into the prepared hole formed in the interlayer insulating film 15, the hole being used as a connection portion between the second top electrode 11 and the plug 19, can be suppressed, whereby generation of a void can be suppressed.

The hard mask film 12 is a film used as a hard mask when etching the second top electrode 11, the first top electrode 10, and the variable resistance element film 9. For example, a SiN film or the like can be used as the hard mask film 12. It is preferable that the hard mask film 12 be made of a material identical to that of the protective insulating film 14 and the insulating barrier film 7. Namely, by covering the variable resistance element 22 with an identical material, a uniform material interface can be obtained. Therefore, ingress of moisture or the like from the outside can be prevented, and removal of any of the films 7, 12, and 14 from the variable resistance element 22 can be prevented.

The protective insulating film 14 serves to prevent damage to the variable resistance element 22 and removal of oxygen from the variable resistance element film 9. For example, a SiN film, a SiCN film, or the like can be used as the protective insulating film 14. It is preferable that the protective insulating film 14 be made of a material identical to that of the hard mask film 12 and the insulating barrier film 7. If made of an identical material, the protective insulating film 14 can be integrated with the insulating barrier film 7 and the hard mask film 12. Thus, since adherence of the interface is improved, the variable resistance element 22 can be protected more securely.

The interlayer insulating film 15 is formed on the protective insulating film 14. For example, a silicon oxide film, a SiOC film, or a low-dielectric-constant film (SiOCH film, for example) having a relative dielectric constant lower than that of a silicon oxide film can be used as the interlayer insulating film 15. The interlayer insulating film 15 may be formed by stacking a plurality of insulating films. The interlayer insulating film 15 may be made of a material identical to that of the interlayer insulating film 17. A prepared hole for embedding the plug 19 is formed in the interlayer insulating film 15. The plug 19 is embedded in the prepared hole via the barrier metal 20.

The etching stopper film 16 is an insulating film arranged between the interlayer insulating films 15 and 17. The etching stopper film 16 serves as an etching stop layer when a wiring trench for the second wiring 18 is processed. For example, a SiN film, a SiC film, a SiCN film, or the like can be used as the etching stopper film 16. A wiring trench for embedding the second wiring 18 is formed in the etching stopper film 16. The second wiring 18 is embedded in the wiring trench via barrier metal 20. The etching stopper film 16 may be deleted, depending on selection of etching conditions of the wiring trench.

The interlayer insulating film 17 is formed on the etching stopper film 16. For example, a silicon oxide film, a SiOC film, or a low dielectric constant film (SiOCH film, for example) having a relative dielectric constant lower than that of a silicon oxide film can be used as the interlayer insulating film 17. The interlayer insulating film 17 may be formed by stacking a plurality of insulating films. The interlayer insulating film 17 may be made of a material identical to that of the interlayer insulating film 15. A wiring trench for embedding the second wiring 18 is formed in the interlayer insulating film 17. The second wiring 18 is embedded in the wiring trench via the barrier metal 20.

The second wiring 18 is embedded in the wiring trench formed in the interlayer insulating film 17 and the etching stopper film 16 via the barrier metal 20. The second wiring 18 is integrated with the plug 19. The plug 19 is embedded in the prepared hole formed in the interlayer insulating film 15, the protective insulating film 14, and the hard mask film 12 via the barrier metal 20. The plug 19 is electrically connected to the second top electrode 11 via the barrier metal 20. For example, Cu can be used as the second wiring 18 and the plug 19. To inhibit defects of embedment of a plate into the prepared hole, the diameter R2 (or the area) of the region where the plug 19 (the barrier metal 20, to be exact) and the second top electrode 11 are in contact with each other is set to be smaller than the diameter R1 (or the area) of the region where the first wiring 5 and the variable resistance element film 9 are in contact with each other.

The barrier metal 20 is a conductive film that has barrier properties and covers the side and bottom surfaces of the second wiring 18 and the plug 19, to prevent the metal of the second wiring 18 (including the plug 19) from diffusing into the interlayer insulating films 15 and 17 and lower layers. For example, if the second wiring 18 and the plug 19 are made of metal elements including Cu as a primary component, a high-melting-point metal such as tantalum (Ta), tantalum nitride (TaN), titanium nitride (TiN), or tungsten carbonitride (WCN), nitride of such metal, or laminate layers of such films can be used as the barrier metal 20. It is preferable that the barrier metal 20 be made of a material identical to that of the second top electrode 11. For example, if the barrier metal 20 has a multilayer (laminate) structure of TaN (lower layer)/Ta (upper layer), it is preferable that the second top electrode 11 be made of TaN used as the lower layer material. Alternatively, if the barrier metal 20 is made of Ti (lower layer)/Ru (upper layer), it is preferable that the lower layer material Ti be used as the second top electrode 11.

The barrier insulating film 21 is formed on the interlayer insulating film 17 including the second wiring 18 and serves to prevent oxidation of the metal (Cu, for example) of the second wiring 18 and diffusion of the metal of the second wiring 18 into upper layers. For example, a SiC film, a SiCN film, a SiN film, or a multilayer (laminate) structure of such films can be used as the barrier insulating film 21.

Next, a method of manufacturing the semiconductor device according to example 1 of the present invention will be described with reference to the drawings. FIGS. 2A to 5B are cross-sectional views schematically illustrating processes of a method of manufacturing the semiconductor device according to example 1 of the present invention.

First, the interlayer insulating film 2 (a silicon oxide film having a film thickness of 300 nm, for example) is deposited on the semiconductor substrate 1 (a substrate on which semiconductor elements are formed, for example). Next, the barrier insulating film 3 (a SiN film having a film thickness of 50 nm, for example) is deposited on the interlayer insulating film 2. Next, the interlayer insulating film 4 (a silicon oxide film having a film thickness of 300 nm, for example) is deposited on the barrier insulating film 3. Next, by using a lithography method (including photoresist formation, dry etching, and photoresist removal), a wiring trench is formed in the interlayer insulating film 4 and the barrier insulating film 3. Next, the first wiring 5 (copper, for example) is embedded in the wiring trench via the barrier metal 6 (TaN/Ta having a film thickness of 5 nm/5 nm, for example) (see step A1 in FIG. 2A).

In step A1, the interlayer insulating films 2 and 4 can be formed by a plasma CVD method. In the plasma CVD (Chemical Vapor Deposition) method, for example, a vaporized gas or liquid material is continuously supplied into a reaction chamber under a reduced pressure. Molecules of the material are excited because of the plasma energy. A continuous film is formed on a substrate by a gas phase reaction, a substrate surface reaction, or the like.

In addition, in step A1, for example, the first wiring 5 can be formed by: forming the barrier metal 6 (layers of films TaN/Ta, for example) by a PVD method; forming a Cu seed by a PVD method; embedding copper in the wiring trench by an electrolytic plating method; executing a heat treatment at a temperature of 200° C. or more; and removing excess copper that is present outside the wiring trench by a CMP method. While the copper wiring can be formed by such series of procedures, a general method known in the art can be used. In the CMP (Chemical Mechanical Polishing) method, irregularity of the wafer surface caused in the step of forming a multilayer wiring is brought in contact with a rotating polishing pad while a polishing liquid is allowed to flow on the wafer surface. In this way, the irregularity of the wafer surface is polished. By polishing the excess portion of the copper embedded in the trench, an embedded wiring (damascene wiring) is formed, and by polishing the interlayer insulating film, planarization is carried out.

Figure 2A:
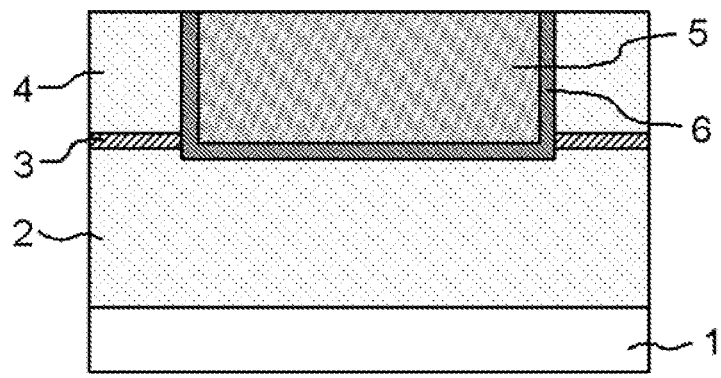
FIGS. 2A, 2B and 2C illustrate cross-sectional views schematically illustrating a first process of a method of manufacturing the semiconductor device according to example 1 of the present invention.
Figure 2B:
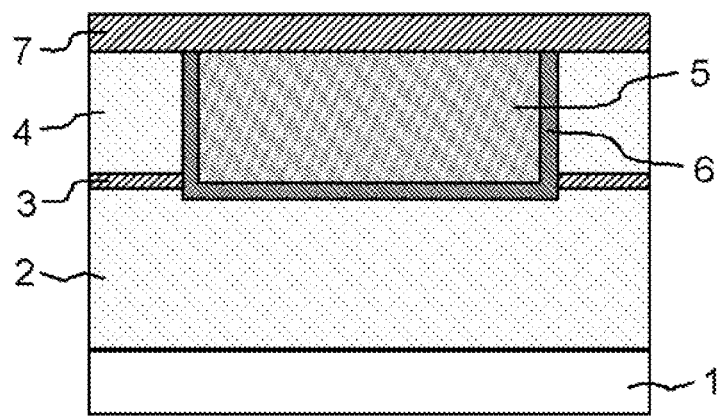

Next, the insulating barrier film 7 (a SiN film having a film thickness of 50 nm, for example) is formed on the interlayer insulating film 4 including the first wiring 5 (see step A2 in FIG. 2B). The insulating barrier film 7 can be formed by a plasma CVD method. It is preferable that the insulating barrier film 7 have a film thickness of approximately, 10 nm to 50 nm.

Figure 2C:
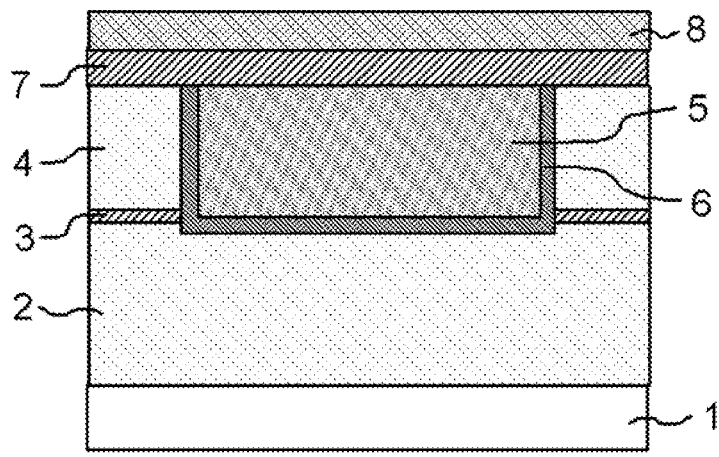

Next, the hard mask film 8 (a silicon oxide film, for example) is formed on the insulating barrier film 7 (see step A3 in FIG. 2C). It is preferable that the hard mask film 8 be made of a material different from that of the insulating barrier film 7, in order to maintain large etching selectivity during a dry etching process. The hard mask film 8 may be an insulating film or a conducting film. For example, a silicon oxide film, a silicon nitride film, TiN, Ti, Ta, TaN or the like can be used as the hard mask film 8. Alternatively, a multilayer (laminate) body of $SiN/SiO_2$ may be used.

Next, a photoresist (not illustrated) is used on the hard mask film 8 to pattern an opening. By using the photoresist as a mask, dry etching is executed to form an opening pattern in the hard mask film 8. Next, the photoresist is stripped by oxygen plasma ashing or the like (see step A4 in FIG. 3A). In the above step, the dry etching does not necessarily stop on the top surface of the insulating barrier film 7. An inner portion of the insulating barrier film 7 may also be dry-etched.

Next, by using the hard mask film 8 (8 in FIG. 3A) as a mask, the insulating barrier film 7 exposed in the opening in the hard mask film 8 is etched back (dry etching). As a result, since an opening is formed in the insulating barrier film 7, the first wiring 5 is exposed in the opening in the insulating barrier film 7. Next, by using an amine-based stripping solution or the like and executing an organic stripping process, oxidized copper formed on the exposed surface of the first wiring 5 and etching byproducts or the like generated during the etch-back process are removed (see step A5 in FIG. 3B).

In step A5, it is preferable that the hard mask film (8 in FIG. 3A) be completely removed during the etch-back process. However, if the hard mask film is an insulating material, the hard mask film may be allowed to remain. The opening in the insulating barrier film 7 has a circular shape and has a diameter of 30 nm to 500 nm.

In addition, in step A5, when the insulating barrier film 7 is etched back, reactive dry etching can be used. In this way, the wall surface of the opening in the insulating barrier film 7 can be formed to be a tapered surface. In reactive dry etching, a fluorocarbon-containing gas can be used as the etching gas.

Figure 3A:
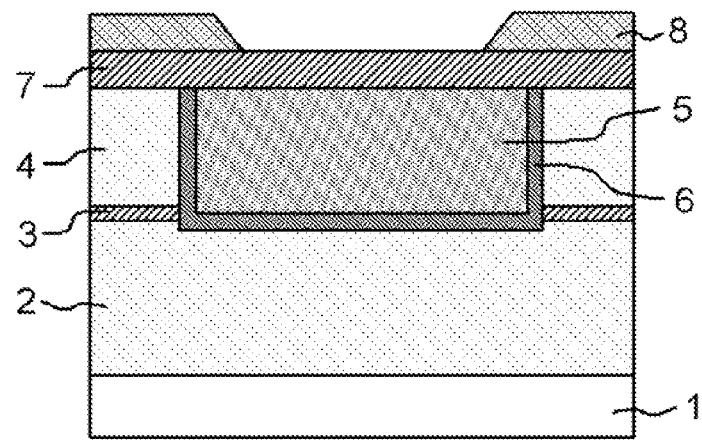
FIGS. 3A, 3B and 3C illustrate cross-sectional views schematically illustrating a second process of the method of manufacturing the semiconductor device according to example 1 of the present invention.
Figure 3B:
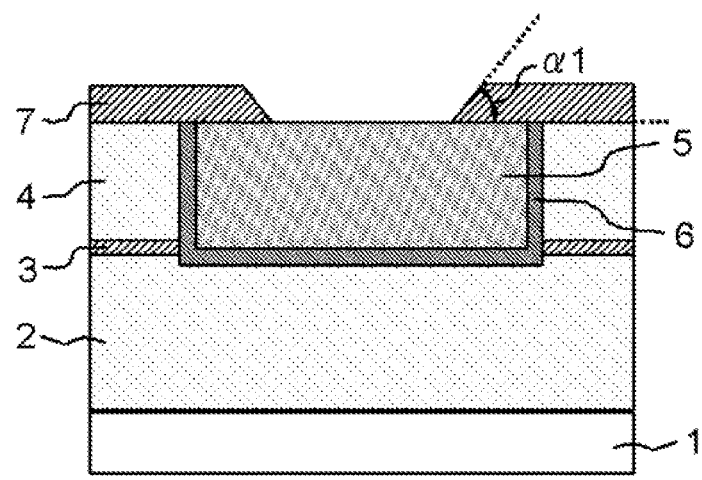

Next, the oxide on the surface of the first wiring 5 is removed by RF (Radio Frequency) etching using an inactive gas, and the tapered surface of the opening in the insulating barrier film 7 is adjusted to have a desired taper angle (85 degrees or less) (see step A6 in FIG. 3B).

Since the wall surface of the opening in the insulating barrier film 7 is formed to be tapered by the reactive dry etching in advance in step A5, when executing the RF etching in step A6, the taper angle can be adjusted without carrying out excess RF etching. Either He or Ar can be used as the inactive gas.

If the variable resistance element film (9 in FIG. 3C) is an oxide insulator, regarding embedment properties inside the opening in the insulating barrier film 7, it is more difficult to control the directivity. As a result, it is difficult to maintain uniform coverage, compared with conventional metal-based sputtering techniques. Thus, by using both of the dry etching process (step A5) and the RF etching process (step A6), the desired taper angle $\alpha 1$ needs to be formed, while preventing damage (oxidation) to the first wiring 5 present as a lower layer.

For example, while dry etching is normally executed by using a CF-based gas, if etching conditions are set only in view of the taper angle $\alpha 1$, a deposit of the CF-based gas is generated. As a result, a sufficient opening cannot be formed.

If the taper angle $\alpha 1$ is adjusted only by RF etching, since the first wiring 5 at the bottom of the opening in the insulating barrier film 7 is etched excessively, the metal (copper) of the first wiring 5 is dispersed by the excessive etching and the surface of the insulating barrier film 7 is contaminated by the copper. As a result, roughness of the surface of the first wiring 5 is increased and reliability of the element is deteriorated.

As a result of intensive studies by the present inventors, it was found that, if RF etching is executed on a $SiO_2$ film formed by plasma CVD in a range from 3 nm to 10 nm, the taper angle is reduced depending on the amount of the RF etching. It was also found that, if the step of etching back the insulating barrier film 7 is not used in step A5, excess RF etching is required to obtain the same taper angle $\alpha 1$. For example, it was found that, if RF etching is executed on a $SiO_2$ film by 20 nm, the copper at the bottom of the opening in the insulating barrier film 7 is excessively etched, resulting in generation of a depressed area on the copper surface and deterioration in roughness.

Figure 3C:
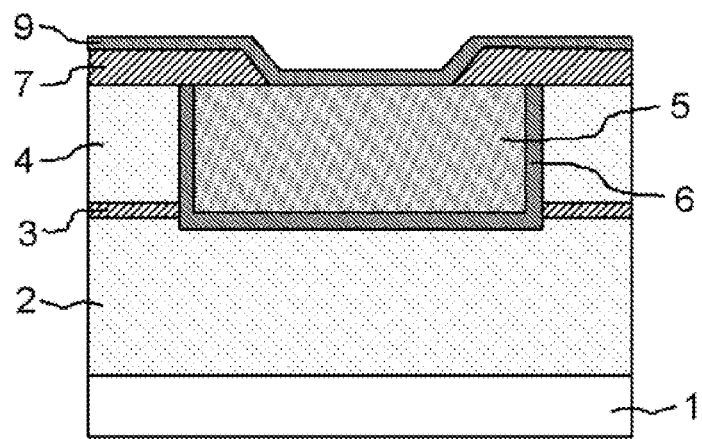

Next, the variable resistance element film 9 ($Ta_2O_5$ having a film thickness of 15 nm, for example) is deposited on the insulating barrier film 7 including the first wiring 5 (see step A7 in FIG. 3C). The variable resistance element film 9 can be formed by using a PVD method or a CVD method.

Since moisture or the like is attached in the opening in the insulating barrier film 7 by the organic stripping process in step A5, prior to the deposition of the variable resistance element film 9 in step A7, it is preferable that a heat treatment be executed at a temperature of approximately 250° C. to 350° C. under a reduced pressure for degassing. Care is required so as not to oxidize the copper surface again. The heat treatment needs to be executed under vacuum or in a nitrogen atmosphere, for example.

In addition, prior to the deposition of the variable resistance element film 9 in step A7, a $SiH_4$ gas may be emitted to the first wiring 5 exposed in the opening in the insulating barrier film 7 at approximately 350° C. under a reduced pressure. In this way, the surface of the first wiring 5 can be converted into silicide and diffusion of the metal (copper, for example) of the first wiring 5 during processing can be suppressed. Alternatively, when forming the first wiring 5, approximately 1 atm % of Al may be added to the Cu seed layer. In this way, the Al can be diffused inside the Cu during annealing of the Cu electrolytic plating film, and as a result, the copper can be alloyed. Such conversion of copper into an alloy or a silicide is effective in inhibiting movement of the copper that comes into contact with the variable resistance element film 9 (stabilization of the copper), whereby reliability of the semiconductor device can be improved when operated at a high temperature.

Further, prior to the deposition of the variable resistance element film 9 in step A7, by using an $NH_3$ or $N_2$ gas, a plasma treatment (nitriding treatment) may be executed on the first wiring 5 exposed in the opening in the insulating barrier film 7. In this way, when the variable resistance element film 9 is formed, oxidation of the first wiring 5 (copper) can be suppressed and thermal diffusion (material transfer) of copper can be suppressed during processing.

Further, in step A7, instead of an ion conducting layer, if a transition metal oxide (TiO, NiO, or the like, for example) is used as the variable resistance element film 9, prior to the deposition of the variable resistance element film 9, a second bottom electrode (not illustrated; corresponding to 5c in FIG. 13) may be formed. For example, Ti, TiN, W, WN, Ta, TaN, Ru, $RuO_x$, or the like can be used as the second bottom electrode. Alternatively, for example, a multilayer (laminate) structure of such elements (TaN (lower layer)/Ru (upper layer), for example) may be used. The variable resistance element 9 is formed in via interlayer insulating films. Thus, in order to reduce device unevenness of surface roughness, the total film thickness of the multilayer (laminate) structure needs to be smaller than that of the insulating barrier film 7. It is preferable that the total film thickness of the multilayer (laminate) structure be 10 nm or less.

Figure 4A:
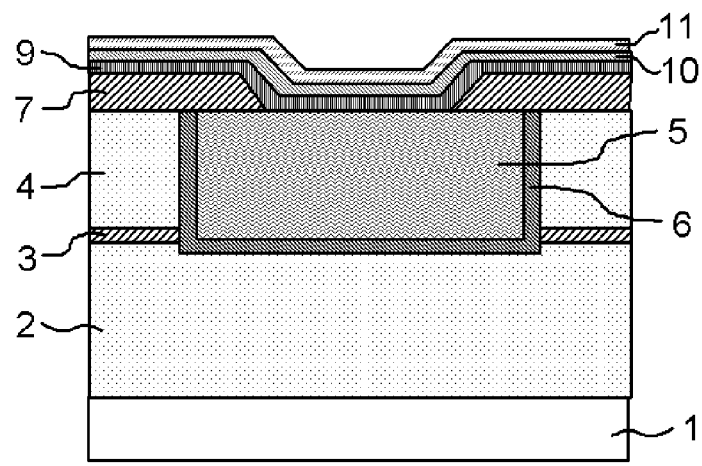
FIGS. 4A, 4B and 4C illustrate cross-sectional views schematically illustrating a third process of the method of manufacturing the semiconductor device according to example 1 of the present invention.

Next, the first top electrode 10 (Ru having a film thickness of 10 nm, for example) and the second top electrode 11 (Ta having a film thickness of 150 nm, for example) are formed in this order on the variable resistance element film 9 (see step A8 in FIG. 4A).

Figure 4B:
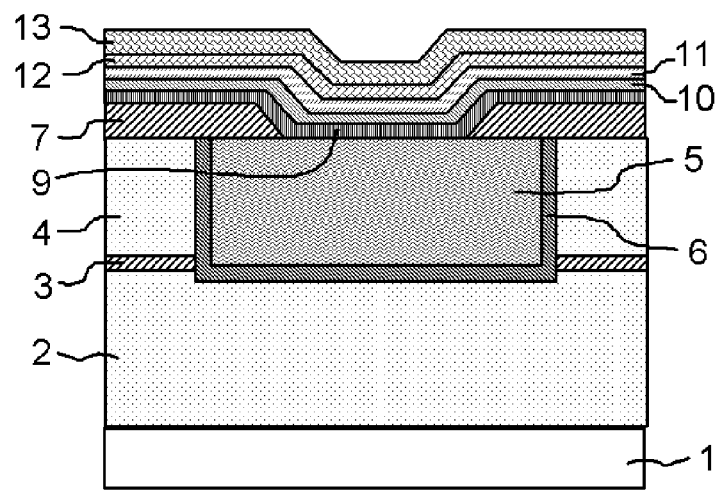
Figure 4C:
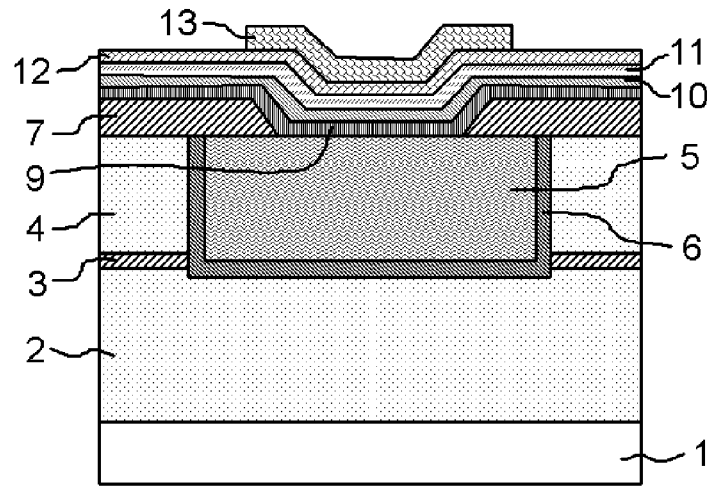

Next, the hard mask film 12 (a SiN film having a film thickness of 30 nm, for example) and the hard mask film 13 (a $SiO_2$ film having a film thickness of 200 nm, for example) are stacked in this order on the second top electrode 11 (see step A9 in FIG. 4B).

In step A9, the hard mask film 12 and the hard mask film 13 can be formed by using a plasma CVD method. A general plasma CVD method known in the art can be used to form the hard mask films 12 and 13. It is preferable that the hard mask film 12 and the hard mask film 13 be films of different types. For example, a SiN film and a $SiO_2$ film can be formed as the hard mask film 12 and the hard mask film 13, respectively. It is preferable that the hard mask film 12 be made of a material identical to that of the protective insulating film 14 to be described later and the insulating barrier film 7. Namely, by covering the variable resistance element with an identical material, a uniform material interface can be obtained. Therefore, ingress of moisture or the like from the outside can be prevented, and removal of any of the films from the variable resistance element can be prevented. In addition, while the hard mask film 12 can be formed by a plasma CVD method, prior to the film formation, the pressure needs to be maintained at a reduced level in a reaction chamber. This process may cause removal of oxygen from the variable resistance element film 9 and the deficiency of oxygen may increase the leakage current from the ion conducting layer, counted as a problem. To prevent such problem, the film formation temperature needs to be 350° C. or less. It is preferable that the temperature be 250° C. or less. In addition, since the material is exposed to a film formation gas under a reduced pressure prior to the film formation, it is preferable that no reducing gas be used. For example, it is preferable that a SiN film etc. be formed by using a mixed gas of $SiH_4/N_2$ in high-density plasma at a substrate temperature of 200° C.

Next, to pattern a variable resistance element portion, a photoresist (not illustrated) is formed on the hard mask film 13. Next, by using the photoresist as a mask, the hard mask film 13 is dry-etched until the hard mask film 12 is exposed. Next, by using oxygen plasma ashing and organic stripping, the photoresist is removed (see step A10 in FIG. 4C).

Figure 5A:
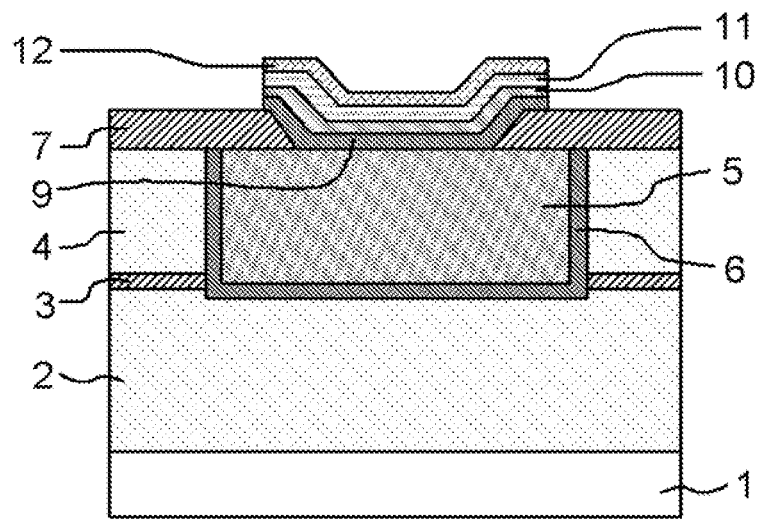
FIGS. 5A and 5B illustrate cross-sectional views schematically illustrating a fourth process of the method of manufacturing the semiconductor device according to example 1 of the present invention.

Next, by using the hard mask film (13 in FIG. 4C) as a mask, the hard mask film 12, the second top electrode 11, the first top electrode 10, and the variable resistance element film 9 are dry-etched continuously (see step A11 in FIG. 5A). In this process, while it is preferable that the hard mask film (13 in FIG. 4C) be completely removed during the etch-back process, the hard mask film may be allowed to remain.

In step A11, for example, if the second top electrode 11 is made of Ta, processing can be executed by a $Cl_2$-based RIE. If the first top electrode 10 is made of Ru, processing can be executed by RIE using a mixed gas of $Cl_2/O_2$. In addition, during etching of the variable resistance element film 9, when the insulating barrier film 7 as a lower surface is reached, the dry etching needs to be stopped. If the variable resistance element film 9 is an oxide including Ta and the insulating barrier film 7 is a SiN film or a SiCN film, by adjusting etching conditions with a $CF_4$-based gas, a $CF_4/Cl_2$-based mixed gas, a $CF_4/Cl_2/Ar$-based mixed gas, or the like, the films can be processed by RIE. By using such hard mask RIE method, the variable resistance element portion can be processed, without causing the variable resistance element portion to be exposed to oxygen plasma ashing to remove the resist. In addition, if an oxidation treatment is carried out by oxygen plasma after the process, the oxidation plasma treatment can be carried out irrespective of the stripping time of the resist.

Figure 5B:
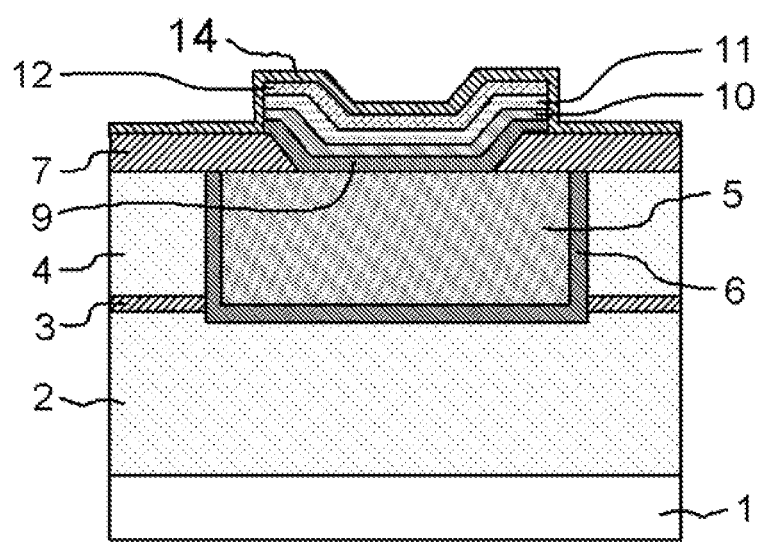

Next, the protective insulating film 14 (a SiN film of 30 nm, for example) is deposited on the insulating barrier film 7 including the hard mask film 12, the second top electrode 11, the first top electrode 10, and the variable resistance element film 9 (see step A12 in FIG. 5B).

In step A12, while the protective insulating film 14 can be formed by a plasma CVD method, prior to the film formation, the pressure needs to be maintained at a reduced level in a reaction chamber. This process may cause removal of oxygen from the side surface of the variable resistance element film 9 and increase the leakage current from the ion conducting layer, counted as a problem. To prevent such problem, it is preferable that the film formation temperature of the protective insulating film 14 be 250° C. or less. In addition, since the material is exposed to a film formation gas under a reduced pressure prior to the film formation, it is preferable that no reducing gas be used. For example, it is preferable that a SiN film be formed by using a mixed gas of $SiH_4/N_2$ in high-density plasma at a substrate temperature of 200° C.

Next, the interlayer insulating film 15 (a silicon oxide film, for example), the etching stopper film 16 (a SiN film, for example), and the interlayer insulating film 17 (a silicon oxide film, for example) are deposited in this order on the protective insulating film 14. Next, a Wiring trench for the second wiring 18 and a prepared hole for the plug 19 are formed. By using a copper dual-damascene interconnection process, the second wiring 18 (Cu, for example) and the plug 19 (Cu, for example) are simultaneously formed in the wiring trench and the prepared hole, respectively, via the barrier metal 20 (TaN/Ta, for example). Next, the insulating barrier film 21 (a SiN film, for example) is deposited on the interlayer insulating film 17 including the second wiring 18 (see step A13 in FIG. 1).

In step A13, the second wiring 18 can be formed by a process similar to that used to form the lower layer wirings. In this process, the barrier metal 20 is made of a material identical to that of the second top electrode 11. In this way, the contact resistance between the plug 19 and the second top electrode 11 can be reduced. As a result, element performance can be improved (reduction in resistance of the variable resistance element 22 during ON).

In addition, in step A13, the interlayer insulating film 15 and the interlayer insulating film 17 can be formed by a plasma CVD method.

In addition, in step A13, to control the unevenness formed by the variable resistance element 22, the interlayer insulating film 15 may be thickly deposited first. Next, by polishing the interlayer insulating film 15 by CMP for planarization, the interlayer insulating film 15 can be formed to have a desired film thickness.

According to example 1, the first wiring 5 is used as a bottom electrode of the variable resistance element 22. Namely, since the first wiring 5 also serves as a bottom electrode of the variable resistance element 22, the variable resistance element 22 can have a smaller size. As a result, the density can be increased and the number of processing steps can be simplified. By forming a 2PR mask set as an additional step in addition to a normal Cu damascene wiring step, the variable resistance element 22 can be mounted. At the same time, costs of the device can be reduced. Further, since the wall surface of the opening in the insulating barrier film 7 is formed to have a taper angle of 85 degrees or less, electric field concentration at the periphery of the connection portion between the first wiring 5 and the variable resistance element film 9 (around the periphery of the opening in the insulating barrier film 7) is reduced. Thus, the insulation resistance can be improved. Furthermore, since the variable resistance element 22 can also be mounted in a most-advanced device comprising copper wirings, performance of the device can be improved.

Example 2

Figure 6:
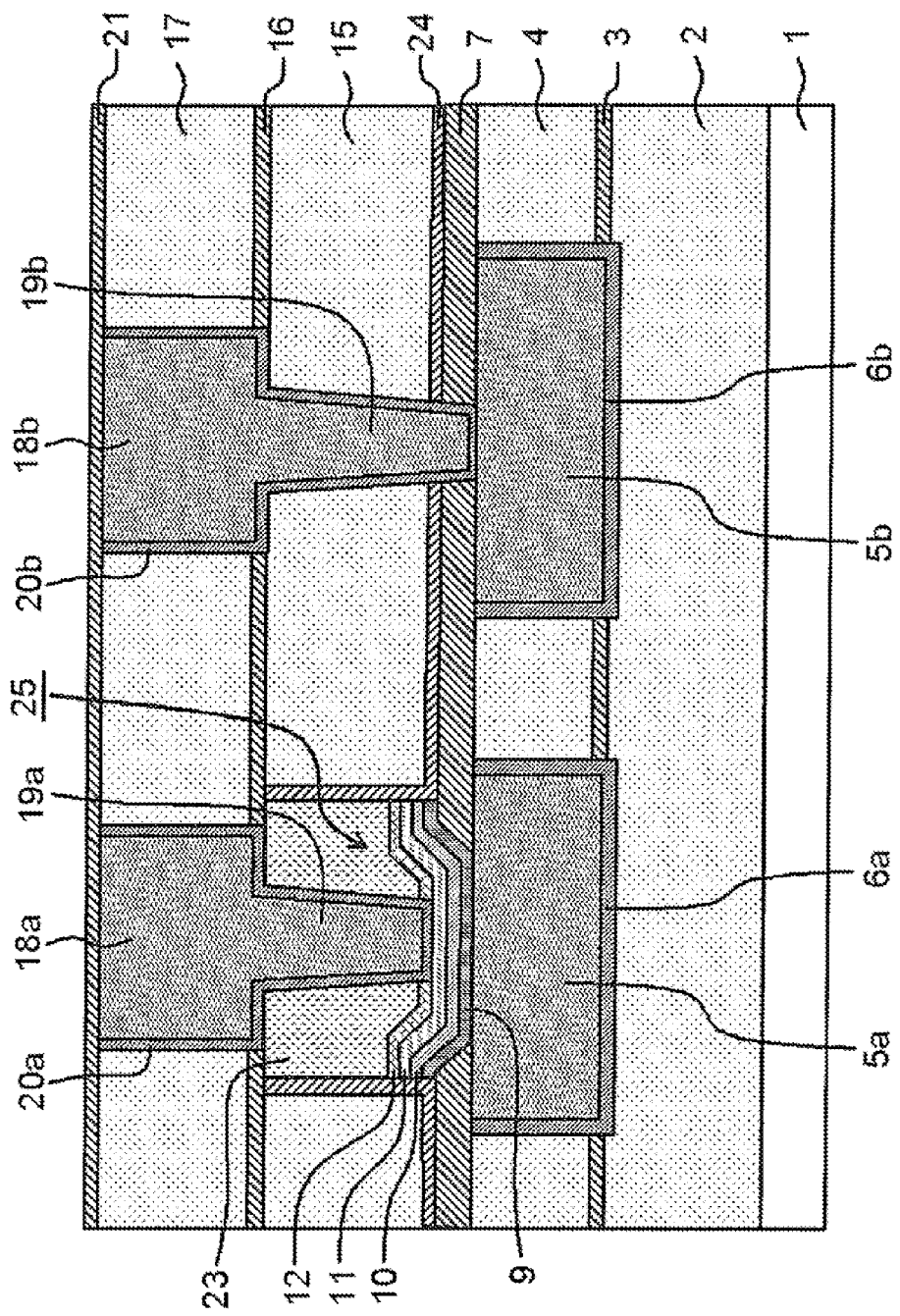
FIG. 6 is a partial cross-sectional view schematically illustrating a configuration of a semiconductor device according to example 2 of the present invention.

A semiconductor device according to example 2 of the present invention will be described with reference to the drawings. FIG. 6 is a partial cross-sectional view schematically illustrating a configuration of the semiconductor device according to example 2 of the present invention.

According to example 1 (see FIG. 1), the top and side surfaces of the multilayer (laminate) body of the variable resistance element film (9 in FIG. 1), the first top electrode (10 in FIG. 1), the second top electrode (11 in FIG. 1), and the hard mask film (12 in FIG. 1) is covered by the protective insulating film (14 in FIG. 1). However, according to example 2, a thick hard mask film 23 is formed on the multilayer (laminate) body of the variable resistance element film 9, the first top electrode 10, the second top electrode 11, and the hard mask film 12. Further, the side surfaces of the variable resistance element film 9, the first top electrode 10, the second top electrode 11, the hard mask film 12, and the hard mask film 23 are covered by a protective insulating film 24. While not formed on the hard mask film 23, the protective insulating film 24 is formed on the insulating barrier film 7. In addition, according to example 2, wiring portions (5b, 18b, 19b) that are not electrically connected to a variable resistance element 25 are also illustrated. The plug 19b of the second wiring 18b is electrically connected to the first wiring 5b via a barrier metal 20b. Other configurations are the same as those according to example 1.

A first wiring 5a is embedded in a wiring trench formed in the interlayer insulating film 4 and the barrier insulating film 3 via a barrier metal 6a. The first wiring 5a also serves as a bottom electrode of the variable resistance element 25 and is in direct contact with the variable resistance element film 9. An electrode layer or the like may be inserted between the first wiring 5a and the variable resistance element film 9. When an electrode layer is formed, the electrode layer and the variable resistance element film 9 are deposited in continuous processes and processed in continuous processes. The first wiring 5a is made of a metal that enables diffusion or ion conduction in the variable resistance element film 9. For example, Cu or the like can be used. A surface of the first wiring 5a may be coated with CuSi.

The first wiring 5b is embedded in a wiring trench formed in the interlayer insulating film 4 and the barrier insulating film 3 via a barrier metal 6b. The first wiring 5b is not connected to the variable resistance element 25 but electrically connected to the plug 19b via the barrier metal 20b. The first wiring 5b is made of a material identical to that of the first wiring 5a. For example, Cu or the like can be used.

Each of the barrier metals 6a and 6b is a conductive film having barrier properties. The barrier metals 6a and 6b cover the side and bottom surfaces of the respective wirings to prevent the metal of the respective first wirings 5a and 5b from diffusing into the interlayer insulating film 4 and lower layers. For example, if the first wirings 5a and 5b are made of metal elements including Cu as a primary component, a high-melting-point metal such as tantalum (Ta), tantalum nitride (TaN), titanium nitride (TiN), or tungsten carbonitride (WCN), nitride of such metal, or layers of such films can be used as the barrier metals 6a and 6b.

A second wiring 18a is embedded in a wiring trench formed in the interlayer insulating film 17 and the etching stopper film 16 via a barrier metal 20a. The second wiring 18a is integrated with a plug 19a. The plug 19a is embedded in a prepared hole formed in the hard mask film 23 and the protective insulating film 24 via the barrier metal 20a. The plug 19a is electrically connected to the second top electrode 11 via the barrier metal 20a. For example, Cu can be used as the second wiring 18a and the plug 19a. To inhibit defects of embedment of a plate into the prepared hole, the diameter (or the area) of the region where the plug 19a (the barrier metal 20a, to be exact) and the second top electrode 11 are in contact with each other is set to be smaller than the diameter (or the area) of the region where the first wiring 5 and the variable resistance element film 9 are in contact with each other.

The second wiring 18b is embedded in a wiring trench formed in the interlayer insulating film 17 and the etching stopper film 16 via the barrier metal 20b. The second wiring 18b is integrated with the plug 19b. The plug 19b is embedded in a prepared hole formed in the interlayer insulating film 15, the protective insulating film 24, and the insulating barrier film 7 via the barrier metal 20b. The plug 19b is electrically connected to the first wiring 5b via the barrier metal 20b. The second wiring 18b and the plug 19b are made of a material identical to that of the second wiring 18a and the plug 19a. For example, Cu can be used.

Each of the barrier metals 20a and 20b is a conductive film having barrier properties. The barrier metals 20a and 20b cover the side and bottom surfaces of the second wirings 18a and 18b and the plugs 19a and 19b, to prevent the metal of the respective second wirings 18a and 18b (including the plugs 19a and 19b) from diffusing into the interlayer insulating films 15 and 17 and lower layers. For example, if the second wirings 18a and 18b and the plugs 19a and 19b are made of metal elements including Cu as a primary component, a high-melting-point metal such as tantalum (Ta), tantalum nitride (TaN), titanium nitride (TiN), or tungsten carbonitride (WCN), nitride of such metal, or layers of such films can be used as the barrier metals 20a and 20b. It is preferable that the barrier metals 20a and 20b be made of a material identical to that of the second top electrode 11. For example, if each of the barrier metals 20a and 20b has a multilayer (laminate) structure of TaN (lower layer)/Ta (upper layer), it is preferable that the second top electrode 11 be made of TaN, which is used as the lower layer material of the barrier metals 20a and 20b. If each of the barrier metals 20a and 20b is made of Ti (lower layer)/Ru (upper layer), it is preferable that the second top electrode 11 be made of Ti, which is used as the lower layer material of the barrier metals 20a and 20b.

The hard mask film 23 is a film used as a hard mask when etching the hard mask film 12. It is preferable that the hard mask film 12 and the hard mask film 23 be films of different types. For example, a SiN film and a SiO$_2$ film can be formed as the hard mask film 12 and the hard mask film 23, respectively.

The protective insulating film 24 serves to prevent removal of oxygen from the variable resistance element film 9 without causing damage to the variable resistance element 25. For example, a SiN film, a SiCN film, or the like can be used as the protective insulating film 24. It is preferable that the protective insulating film 24 be made of a material identical to that of the hard mask film 12 and the insulating barrier film 7. If made of an identical material, the protective insulating film 24 can be integrated with the insulating barrier film 7 and the hard mask film 12. Thus, adherence of the interface is improved.

Next, a method of manufacturing the semiconductor device according to example 2 of the present invention will be described with reference to the drawings. FIGS. 7A to 10B are cross-sectional views schematically illustrating processes of the method of manufacturing the semiconductor device according to example 2 of the present invention.

First, the interlayer insulating film 2 (a silicon oxide film having a film thickness of 300 nm, for example) is deposited on the semiconductor substrate 1 (a substrate on which semiconductor elements are formed, for example). Next, the barrier insulating film 3 (a SiN film having a film thickness of 50 nm, for example) is deposited on the interlayer insulating film 2. Next, the interlayer insulating film 4 (a silicon oxide film having a film thickness of 300 nm, for example) is deposited on the barrier insulating film 3. Next, by using a lithography method (including photoresist formation, dry etching, and photoresist removal), wiring trenches are formed in the interlayer insulating film 4, the barrier insulating film 3, and the interlayer insulating film 2. Next, the first wirings 5a and 5b (copper, for example) are embedded in the wiring trenches via the barrier metals 6a and 6b (TaN/Ta having a film thickness of 5 nm/5 nm, for example), respectively. Next, the insulating barrier film 7 (a SiN film having a film thickness of 50 nm, for example) is formed on the interlayer insulating film 4 including the first wirings 5a and 5b. Next, a hard mask film (while not illustrated, the film is a silicon oxide film or the like corresponding to 8 in FIG. 2C) is formed on the insulating barrier film 7. Next, by using a photoresist (not illustrated), an opening is patterned on the hard mask film (corresponding to 8 in FIG. 2C), and by using the photoresist as a mask, dry etching is carried out. In this way, an opening pattern is formed on the hard mask film (corresponding to 8 in FIG. 3A). Next, by using oxygen plasma ashing or the like, the photoresist is stripped, and by using the hard mask film (corresponding to 8 in FIG. 3A) as a mask, the insulating barrier film 7 exposed in the opening in the hard mask film (corresponding to 8 in FIG. 3A) is etched back (reactive dry etching). As a result, the insulating barrier film 7 is provided with an opening in which the first wiring 5a is exposed. Next, by using an amine-based stripping solution or the like and executing an organic stripping process, oxidized copper formed on the exposed surface of the first wiring 5a and etching byproducts or the like generated during the etch-back process are removed. Next, by emitting a SiH$_4$ gas to the insulating barrier film 7 including the opening under a reduced pressure, the surface of the first wiring 5a exposed in the opening is converted into silicide. Next, by executing heating under a reduced pressure at 350° C. for one minute, the organic components and moisture are removed. Next, RF etching is executed by using an inactive gas, to remove the oxide on the surface of the first wiring 5a and to adjust the tapered surface of the opening in the insulating barrier film 7 to be a desired taper angle (85 degrees or less) (see step B1 in FIG. 7A).

In step B1, the wiring trenches are formed by etching the interlayer insulating film 4 and the barrier insulating film 3. The etching is executed by a depth of a film thickness of the interlayer insulating film 4 and approximately 70 nm deeper than the bottom surface of the interlayer insulating film 4. The wiring trenches run through the barrier insulating film 3 and cut into the top surface of the interlayer insulating film 2 by approximately 20 nm. By etching the barrier insulating film 3 in advance in this way, etching-through characteristics of the wiring trenches can be improved.

Further, in step B1, while reactive dry etching (etch back) is carried out to form the opening in the insulating barrier film 7, the etching can be carried out under CF$_4$/Ar=25:50 sccm, 4 mTorr, source 400 W, and substrate bias 90 W. By decreasing the source power or increasing the substrate bias, the ionicity during the etching can be improved and the taper angle can be decreased. In this step, a film of approximately 30 nm remaining on the bottom of the opening in the insulating barrier film 7 was subjected to etching of approximately 55 nm (approximately 80% over).

In addition, in step B1, when the SiH$_4$ gas is emitted to the insulating barrier film 7 including the opening, by supplying a 50 sccm of SiH$_4$ and a 300 sccm of N$_2$ used as a diluent gas for one minute to the reactor maintained at approximately 2 Torr while maintaining the substrate temperature at 350° C., the surface of the first wiring 5 exposed in the opening may be converted into silicide.

In addition, in step B1, the heating under a reduced pressure at 350° C. can be carried out in a heat chamber included in a sputtering apparatus.

In addition, in step B1, while the RF etching was carried out by using an inactive gas, the etching was carried out in an RF etching chamber by using Ar gas under the conditions of Ar=30 sccm, 10 mTorr, source 290 W, and substrate bias 130 W. The RF etching time can be quantified by the amount of etching on a SiO$_2$ film formed by a plasma CVD method, and the etching amount was set to 3 nm calculated as the SiO$_2$ film.

Upon completion of step B1, the first wiring 5b is still covered by the insulating barrier film 7. Unlike the opening, the first wiring 5b is not subjected to RF etching.

Next, by using a RF (Radio Frequency) sputtering method, the variable resistance element film 9 (Ta$_{0.8}$Si$_{0.2}$O$_x$ having a film thickness of 13 nm, for example) is deposited on the insulating barrier film 7 including the first wirings 5a and 5b. Next, the first top electrode 10 (Ru having a film thickness of 10 nm, for example) and the second top electrode 11 (Ta having a film thickness of 50 nm, for example) are formed in this order on the variable resistance element film 9 (see step B2 in FIG. 7B).

In step B2, in the RF sputtering to form the variable resistance element film 9, tantalum oxide (Ta$_{0.8}$Si$_{0.2}$O$_x$) including Si (20%) can be used as a target. The variable resistance element film 9 can be deposited under RF power 2 KW, room temperature, mixed gas of Ar/O$_2$, and 10 mTorr.

In addition, in step B2, the first top electrode 10 can be deposited by DC (Direct Current) sputtering where Ru is used as a target and under DC power 0.2 kW, Ar gas, and 2 mTorr. The second top electrode 11 can be deposited by DC sputtering where Ta is used as a target and under the same conditions. Both of the top electrodes 10 and 11 are deposited under a reduced pressure. Thus, in order to inhibit removal of oxygen from the variable resistance element film 9, the deposition is carried out at room temperature.

Upon completion of step B2, a cross-sectional view of the device was observed by using a SEM. It was found that the taper angle of the wall surface of the opening in the insulating barrier film 7 was 55 degrees. It became clear that the taper angle is also dependent on the diameter of the opening. Thus, the taper angle can be controlled to be a desired angle (85 degrees or less) considering the individual processes relating to the etch-back conditions, RF etching conditions, and opening diameter.

Upon completion of step B2, the first wiring 5b is still covered by the insulating barrier film 7, the variable resistance element film 9, the first top electrode 10, and the second top electrode 11.

Figure 7A:
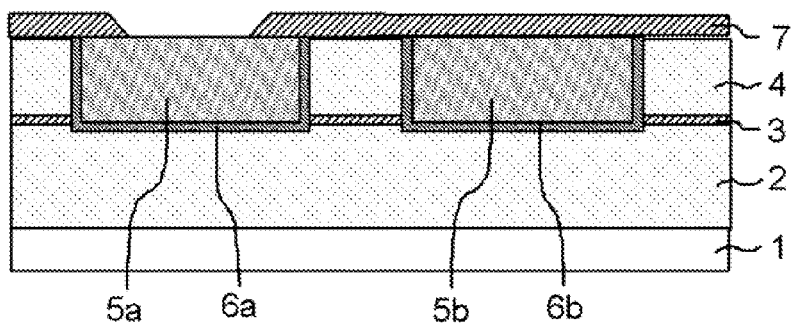
FIGS. 7A, 7B and 7C illustrate cross-sectional views schematically illustrating a first process of a method of manufacturing the semiconductor device according to example 2 of the present invention.
Figure 7B:
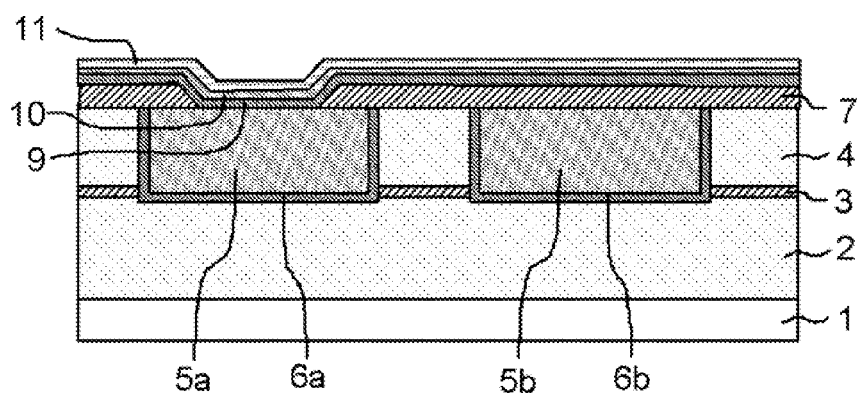
Figure 7C:
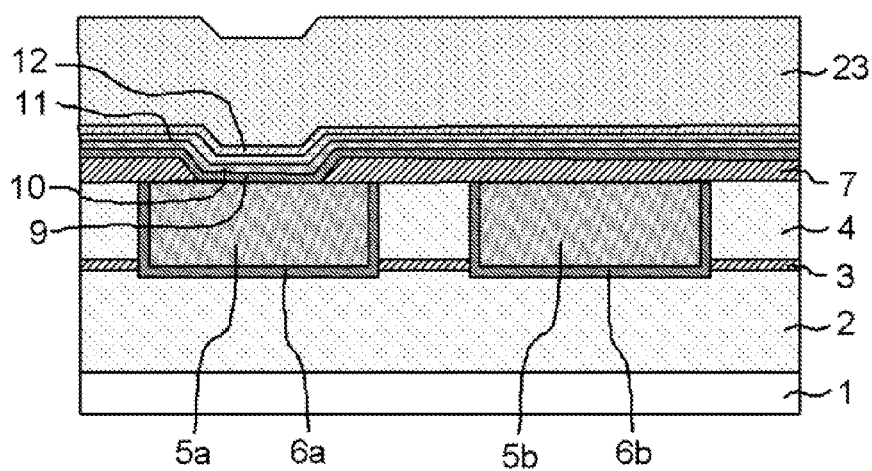

Next, the hard mask film 12 (a SiN film having a film thickness of 30 nm, for example) and the hard mask film 23 (a SiO$_2$ film having a film thickness of 200 nm, for example) are stacked in this order on the second top electrode 11 (see step B3 in FIG. 7C). The hard mask film 12 and the hard mask film 23 can be formed by using a plasma CVD method. A general plasma CVD method known in the art can be used to form the hard mask films 12 and 23. The growth temperature was set to 200° C.

Upon completion of step B2, the first wiring 5b is still covered by the insulating barrier film 7, the variable resistance element film 9, the first top electrode 10, the second top electrode 11, the hard mask film 12, and the hard mask film 23.

Next, to pattern the variable resistance element portion, a photoresist (not illustrated) is formed on the hard mask film 23. Next, by using the photoresist as a mask, the hard mask film 23 is dry-etched until the hard mask film 12 is exposed. Next, by using oxygen plasma ashing and organic stripping, the photoresist is removed. Thereafter, by using the hard mask film 23 as a mask, the hard mask film 12, the second top electrode 11, the first top electrode 10, and the variable resistance element film 9 are dry-etched continuously (see step B4 in FIG. 8A).

In step B4, it is preferable that the dry etching of the hard mask film 23 be stopped on the top surface of or inside the hard mask film 12. In step B4, since covered by the hard mask film 12, the variable resistance element film 9 is not exposed to oxygen plasma. A general parallel-plate-type dry etching apparatus can be used for the dry etching of the hard mask film 23.

In step B4, a parallel-plate-type dry etcher can be used for the etching of the hard mask film 12, the second top electrode 11, the first top electrode 10, and the variable resistance element film 9. The hard mask film 12 (a SiN film, for example) can be etched under the conditions of CF$_4$/Ar=25/50 sccm, 4 mTorr, source 400 W, and substrate bias 90 W. The second top electrode 11 (Ta, for example) can be etched under the conditions of Cl$_2$=50 sccm, 4 mTorr, source 400 W, and substrate bias 60 W. The first top electrode 10 (Ru, for example) can be etched under the conditions of Cl$_2$/O$_2$=5/40 sccm, 4 mTorr, source 900 W, and substrate bias 100 W. The variable resistance element film 9 (Ta$_{0.8}$Si$_{0.2}$O$_x$, for example) can be etched under the conditions of Cl$_2$/CF$_4$/Ar=45/15/15 sccm, 10 mTorr, source 800 W, and substrate bias 60 W. By using such conditions, processing can be carried out while inhibiting generation of a sub-trench or the like. In step B4, the remaining film thickness of the insulating barrier film 7 on the first wirings 5a and 5b was adjusted to 40 nm.

Figure 8A:
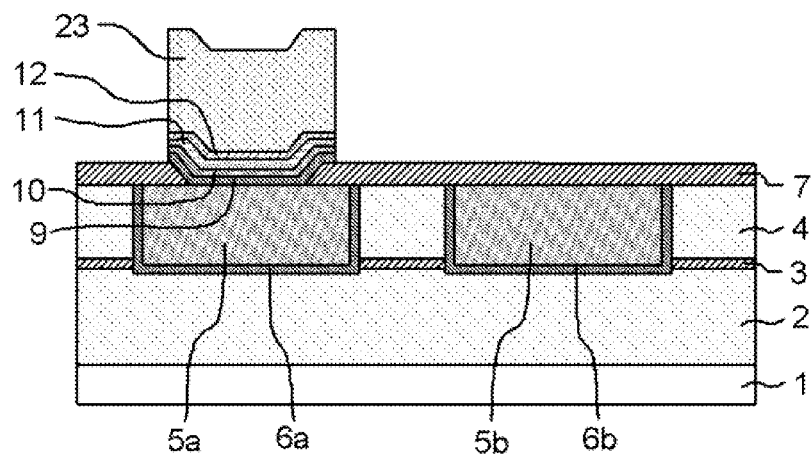
FIGS. 8A, 8B and 8C illustrate cross-sectional views schematically illustrating a second process of the method of manufacturing the semiconductor device according to example 2 of the present invention.
Figure 8B:
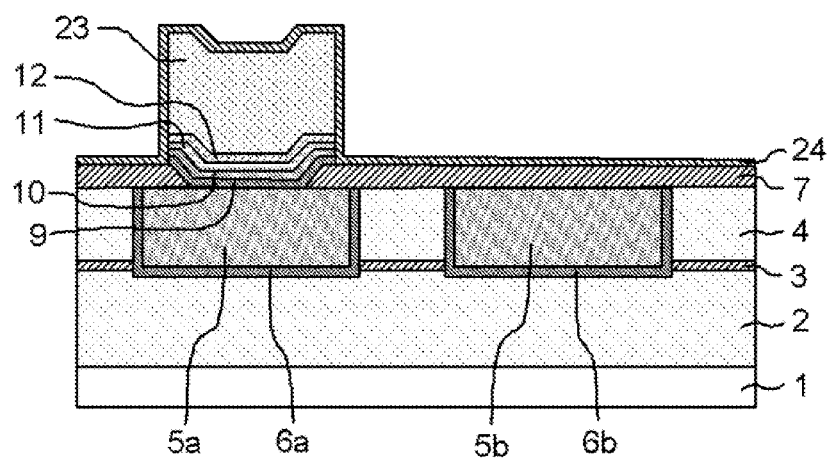

Next, the protective insulating film 24 (a SiN film of 30 nm, for example) is deposited on the insulating barrier film 7 including the hard mask film 23, the hard mask film 12, the second top electrode 11, the first top electrode 10, and the variable resistance element film 9 (see step B5 in FIG. 8B).

In step B5, the protective insulating film 24 can be formed by using SiH$_4$ and N$_2$ as raw material gases and high-density plasma at a substrate temperature of 200° C. Since reducing gases such as NH$_3$ and H$_2$ are not used, reduction of the variable resistance element film 9 (Ta$_{0.8}$Si$_{0.2}$O$_x$, for example) can be suppressed in a film formation gas stabilization process immediately before the film formation. Since the insulating barrier film 7 on the first wiring 5, the protective insulating film 24, and the hard mask film 12 are made of an identical material, that is, a SiN film, the periphery of the variable resistance element can be integrally protected. Thus, since the interface adherence can be improved, the hygroscopicity, water resistance, and oxygen removal resistance can be improved. As a result, the device yield and reliability can be improved.

Figure 8C:
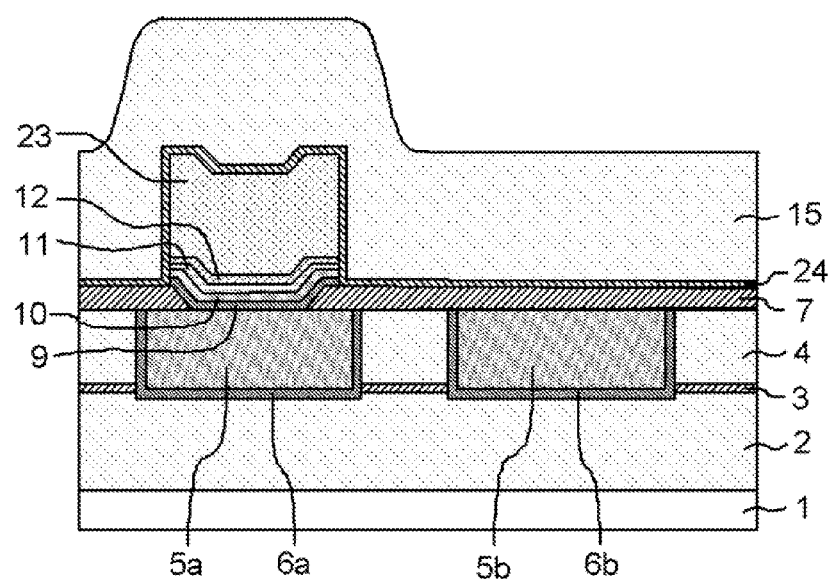

Next, by using a plasma CVD method, the interlayer insulating film 15 (a silicon oxide film having a film thickness of 500 nm, for example) is deposited on the protective insulating film 24 (see step B6 in FIG. 8C).

Figure 9A:
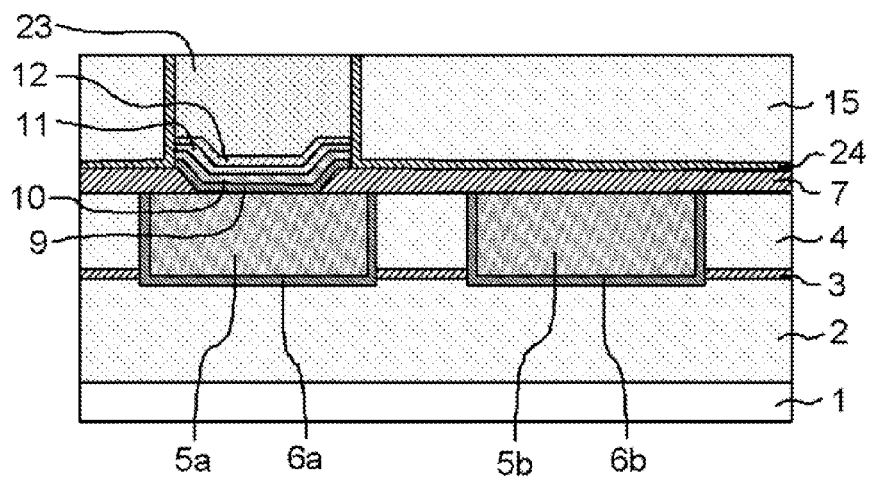
FIGS. 9A and 9B illustrate cross-sectional views schematically illustrating a third process of the method of manufacturing the semiconductor device according to example 2 of the present invention.

Next, by using CMP, the interlayer insulating film 15 is planarized (see step B7 in FIG. 9A). During planarization of the interlayer insulating film 15, the interlayer insulating film 15 is polished approximately 350 nm from the top surface thereof, allowing the remaining film thickness to be approximately 150 nm. During CMP of the interlayer insulating film 15, general colloidal-silica or ceria based slurry can be used. In example 2, because of this planarization of the interlayer insulating film 15, the hard mask film 23 is exposed, and the hard mask film 23 and the protective insulating film 24 are planarized.

Figure 9B:
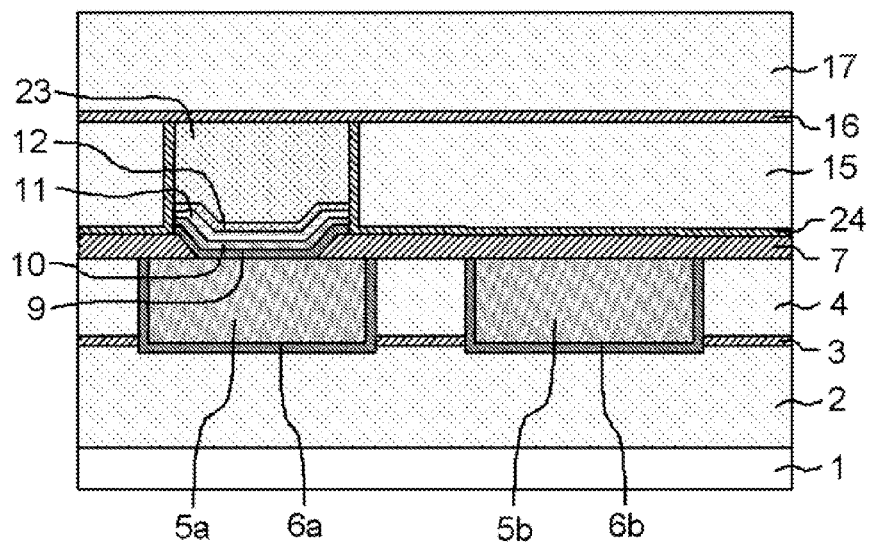
Figure 10A:
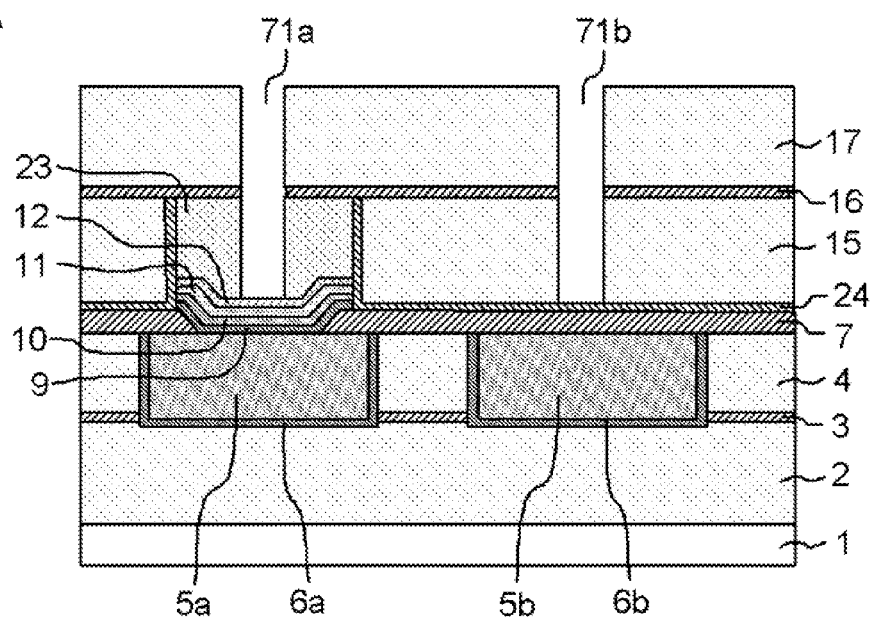
FIGS. 10A and 10B illustrate cross-sectional views schematically illustrating a fourth process of the method of manufacturing the semiconductor device according to example 2 of the present invention.
Figure 10B:
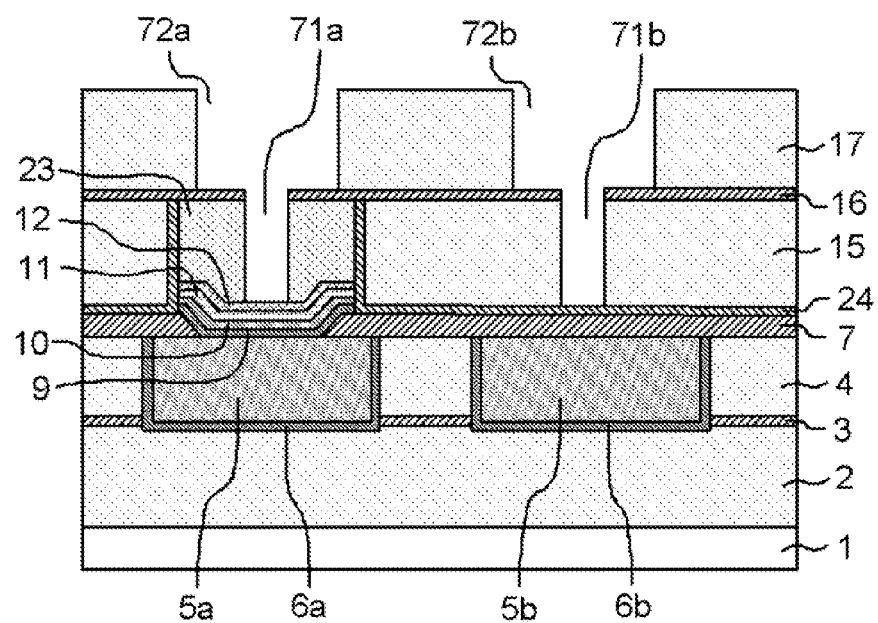

Next, the etching stopper film 16 (a SiN film having a film thickness of 50 nm, for example) and the interlayer insulating film 17 (a silicon oxide film having a film thickness of 300 nm, for example) are stacked in this order on the interlayer insulating film 15 including the hard mask film 23 and the protective insulating film 24 (see step B8 in FIG. 9B).

In step B8, the etching stopper film 16 and the interlayer insulating film 17 can be stacked by using a plasma CVD method.

Next, by using a via-first method of a dual-damascene method, the second wirings (18a and 18b in FIG. 6) and the plugs (19a and 19b in FIG. 6) are formed.

In the via-first method, first, a photoresist (not illustrated) for forming prepared holes 71a and 71b for the plugs (19a and 19b in FIG. 6) is formed on the interlayer insulating film 17. Next, by using the photoresist as a mask and carrying out dry etching, the prepared hole 71a for the plug (19a in FIG. 6) is formed in the interlayer insulating film 17, the etching stopper film 16, and the hard mask film 23. Simultaneously, the prepared hole 71b for the plug (19b in FIG. 6) is formed in the interlayer insulating film 17, the etching stopper film 16, and the interlayer insulating film 15. Thereafter, by carrying out oxygen plasma ashing and organic stripping, the photoresist is removed (see step B9 in FIG. 10A).

In step B9, the etching conditions and time are adjusted so that the dry etching stops when the hard mask film 12 at the bottom of the prepared hole 71a is reached and when the protective insulating film 24 at the bottom of the prepared hole 71b is reached. In step B9, the dry etching stops on or inside the hard mask film 12 and the protective insulating film 24 at the bottom of the prepared holes 71a and 71b, respectively. Thus, each of the prepared holes 71a and 71b may be patterned by using a different reticle. Namely, the prepared holes 71a and 71b may be formed under different dry etching conditions.

Next, a photoresist (not illustrated) for forming wiring trenches 72a and 72b for the second wirings (18a and 18b in FIG. 6) is formed on the interlayer insulating film 17. Then, by using the photoresist as a mask and carrying out dry etching, the wiring trenches 72a and 72b for the second wirings (18a and 18b in FIG. 6) are formed in the interlayer insulating film 17 and the etching stopper film 16. Thereafter, by carrying out oxygen plasma ashing and organic stripping, the photoresist is removed (see step B10 in FIG. 10B).

In step B10, by applying ARC (Anti-Reflection Coating) or the like on the bottom of each of the prepared holes 71a and 71b, ripping (etching-through) of the bottom of each of the prepared holes 71a and 71b can be prevented.

In addition, in step B10, since the bottom of the prepared hole 71a and that of the prepared hole 71b are protected by the hard mask film 12 and the protective insulating film 24, respectively, no oxidative damage is caused by the oxygen plasma ashing.

Next, the hard mask film 12 at the bottom of the prepared hole 71a is etched. In addition, the protective insulating film 24 and the insulating barrier film 7 at the bottom of the prepared hole 71b are etched. In this way, the second top electrode 11 can be exposed to the prepared hole 71a, and the first wiring 5b can be exposed to the prepared hole 71b. Next, the second wirings 18a and 18b (Cu, for example) and the plugs 19a and 19b (Cu, for example) are simultaneously formed in the wiring trenches 72a and 72b and the prepared holes 71a and 71b via the barrier metals 20a and 20b (Ta having a film thickness of 5 nm, for example), respectively. Next, the insulating barrier film 21 (a SiN film, for example) is stacked on the interlayer insulating film 17 including the second wirings 18a and 18b (see step B11 in FIG. 6).

In step B11, the second wirings 18a and 18b can be formed by a process similar to that used to form lower layer wirings. It is preferable that the diameter (corresponding to R2 in FIG. 1) of the bottom of the plug 19a be smaller than that (corresponding to R1 in FIG. 1) of the opening in the insulating barrier film 7. In example 2, the diameter of the bottom of the plug 19a was set to 240 nm and the diameter of the opening in the insulating barrier film 7 was set to 400 nm. In addition, it is preferable that the width of the first wiring 5a also serving as a bottom electrode of the variable resistance element 25 be larger than the diameter of the opening in the insulating barrier film 7. In addition, by using an identical material for the barrier metal 20a and the second top electrode 11, the contact resistance between the plug 19 and the second top electrode 11 can be reduced. As a result, element performance can be improved (resistance of the variable resistance element 25 during ON can be reduced).

Forming was carried out by applying a voltage of −5 V to the top electrode 10 of the variable resistance element 25 formed as described above, and 100Ω (decreased resistance) was confirmed. By application of a voltage of 0.5 V to the top electrode 10 1 GΩ (increased resistance) was confirmed.

As a comparative example, devices each including a plug (corresponding to 19a) and an insulating barrier film (corresponding to 7) were formed, where the diameter of the bottom of each plug and the diameter of the opening in each film were set to be approximately identical (240 nm). When the devices were measured, it was confirmed that approximately 25% of the devices were not sufficiently formed. After analyzing cross sections of defective devices, it was confirmed that unevenness was formed on the connection surface between the plug (corresponding to 19a) and a top electrode (corresponding to 11) of the variable resistance element. It was found that defective embedment of copper was caused around the unevenness and a void was formed thereby.

In addition, as a comparative example, intentionally, the hard mask film 23 was etched more deeply, the barrier insulating film etch back time was shortened to 5 seconds, and the variable resistance element was formed without carrying out RF etching, so that the wall surface of the opening in the insulating barrier film (corresponding to 7) had a taper angle of approximately 88 degrees. Upon forming with application of a voltage of −5 V it was confirmed that approximately half of the chips exhibited defective leakage currents upon application of the voltage. These chips were unable to carry out a sufficient switching operation.

According to example 2, meritorious effects identical to those of example 1 can be provided. In addition, since the plug 19b is connected to the first wiring 5b in the process in which the plug 19a is connected to the second top electrode 11 of the variable resistance element 25, the number of processing steps can be reduced. Further, in addition to the variable resistance element 25, the periphery of the plug 19a connected to the variable resistance element 25 is covered by the protective insulating film 24 (a SiN film, for example) via the hard mask film 23 (a silicon oxide film, for example). Thus, since the connection portion between the plug 19a and the variable resistance element 25 is sufficiently protected, reliability can be improved.

Example 3

Figure 11:
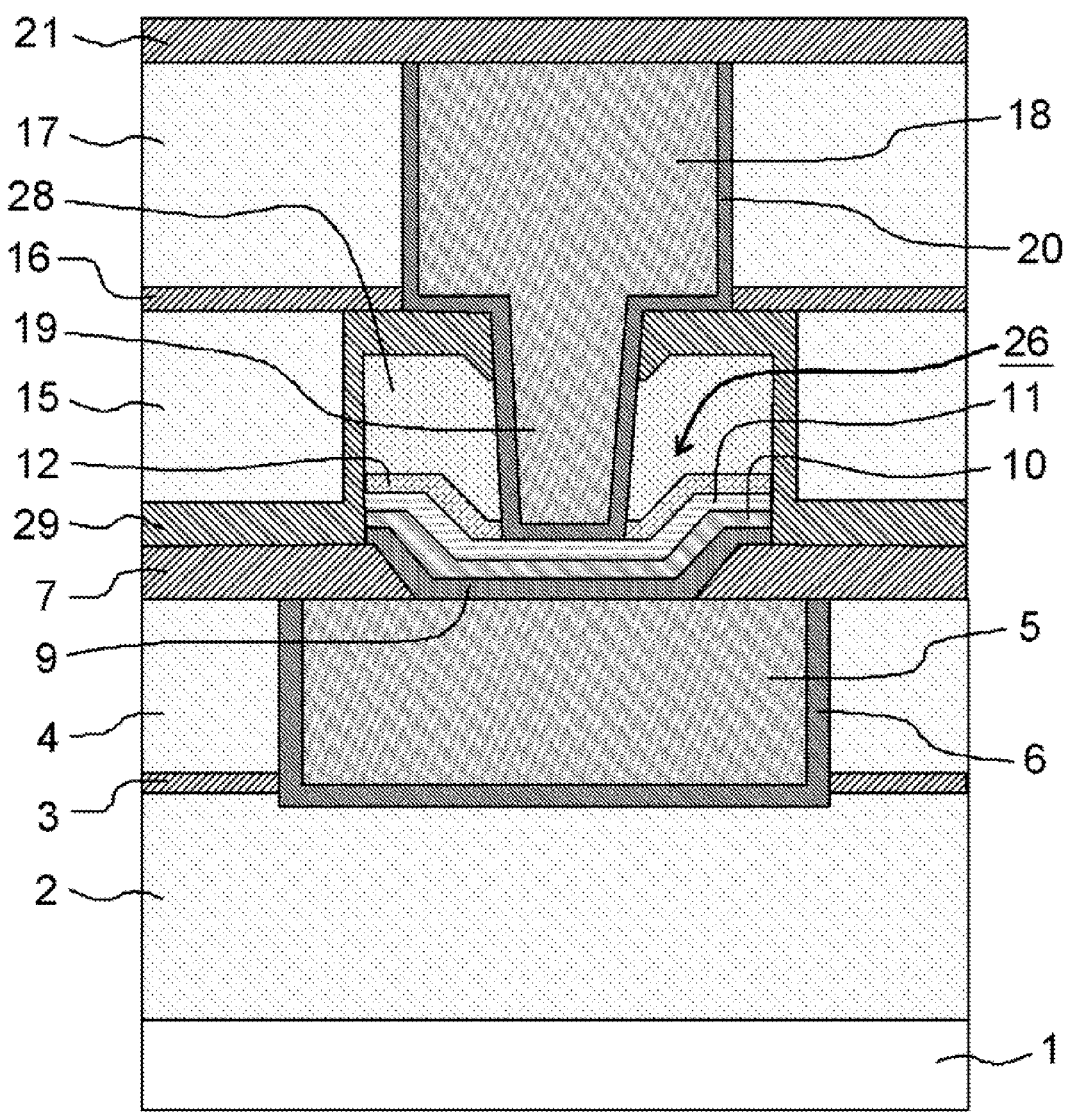
FIG. 11 is a partial cross-sectional view schematically illustrating a configuration of a semiconductor device according to example 3 of the present invention.

A semiconductor device according to example 3 of the present invention will be described with reference to the drawings. FIG. 11 is a partial cross-sectional view schematically illustrating a configuration of a semiconductor device according to example 3 of the present invention.

In example 2 (see FIG. 6), the periphery of the plug (19a in FIG. 6) connected to the variable resistance element (25 in FIG. 6) is covered by the protective insulating film (24 in FIG. 6; a SiN film, for example) via the hard mask film (23 in FIG. 6; a silicon oxide film, for example). However, in example 3, a hard mask film 28 (a silicon oxide film, for example) having a film thickness thinner than that of the hard mask film (23 in FIG. 6) is arranged, a protective insulating film 29 (a SiN film, for example) is arranged on the hard mask film 28, and the plug 19 connected to a variable resistance element 25 is embedded via a barrier metal 20 in a prepared hole formed in the protective insulating film 29, the hard mask film 28, and the hard mask film 12. Other configurations are the same as those according to example 2.

The hard mask film 28 is a film used as a hard mask when etching the hard mask film 12. It is preferable that the hard mask film 28 and the hard mask film 12 be films of different types. For example, a SiN film and a SiO₂ film can be formed as the hard mask film 12 and the hard mask film 28, respectively.

The protective insulating film 29 serves to prevent removal of oxygen from the variable resistance element film 9 without causing damage to the variable resistance element 26. For example, a SiN film, a SiCN film, or the like can be used as the protective insulating film 29. It is preferable that the protective insulating film 29 be made of a material identical to that of the hard mask film 12 and the insulating barrier film 7. If made of an identical material, the protective insulating film 29 can be integrated with the insulating barrier film 7 and the hard mask film 12. Thus, adherence of the interface is improved. It is preferable that the protective insulating film 29 be made of a material identical to that of the etching stopper film 16.

A method of manufacturing the semiconductor device according to example 3 is identical to that according to example 2, except that the hard mask film 28 (corresponding to 23 in FIG. 7C) is formed to have a thinner film thickness in step B3 (see FIG. 7C) of example 2 and that, when the interlayer insulating film 15 is planarized by using CMP, the CMP is carried out until the protective insulating film 29 (24 in FIG. 9A) is exposed in step B7 (see FIG. 9A).

According to example 3, meritorious effects identical to those of example 1 can be provided. In addition, since the hard mask film 28 has a thinner film thickness and the polishing amount of the CMP carried out on the interlayer insulating film 15 is adjusted, the etching stopper film 16 is formed on the protective insulating film 29, both of the films 16 and 29 being made of an identical material. As a result, a prepared hole for the plug 19 can be easily formed.

Example 4

Figure 12:
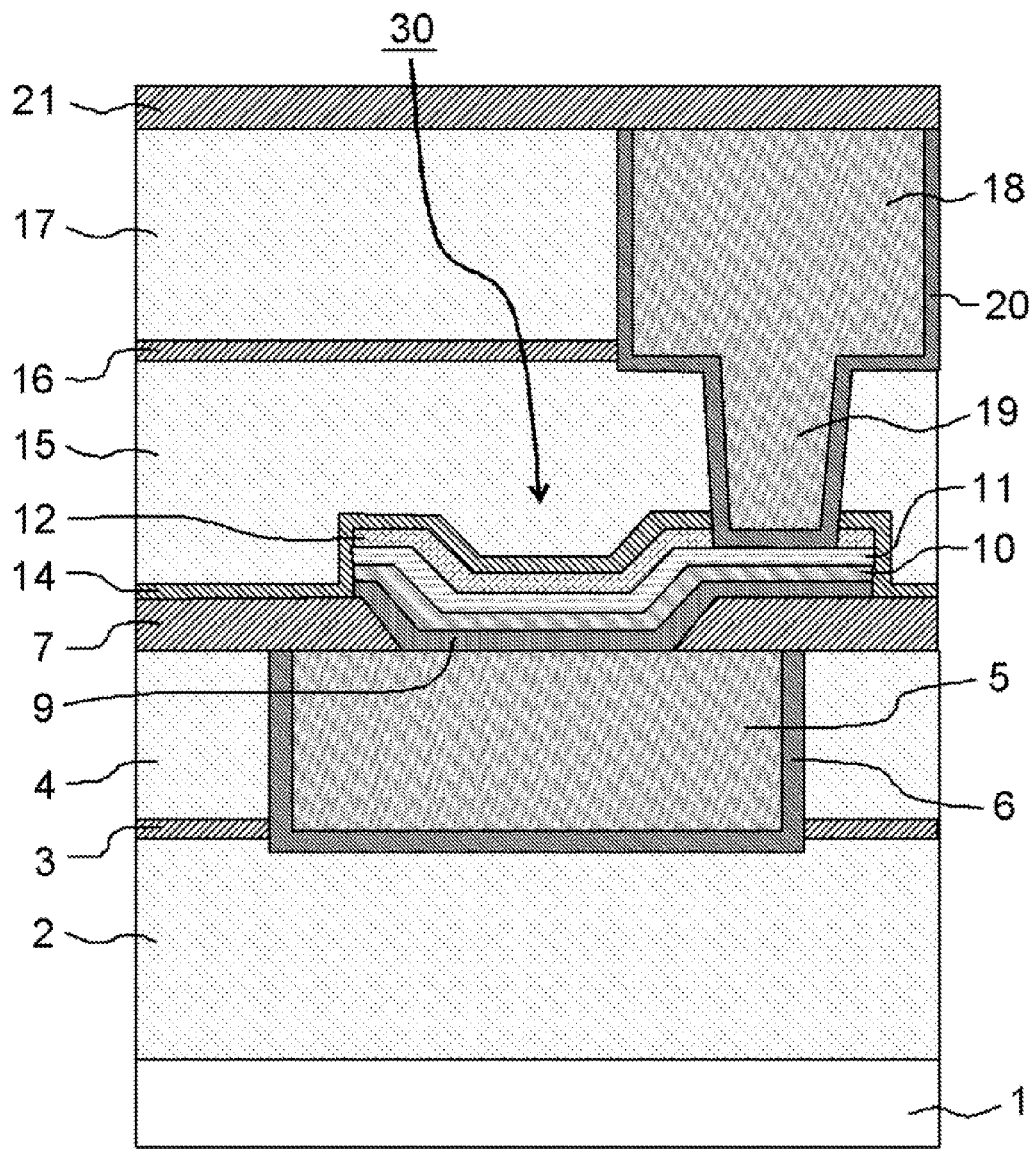
FIG. 12 is a partial cross-sectional view schematically illustrating a configuration of a semiconductor device according to example 4 of the present invention.

A semiconductor device according to example 4 of the present invention will be described with reference to the drawings. FIG. 12 is a partial cross-sectional view schematically illustrating a configuration of a semiconductor device according to example 4 of the present invention.

In example 1 (see FIG. 1), the region where the plug (19 in FIG. 1) is in contact with the second top electrode (11 in FIG. 1) of the variable resistance element (22 in FIG. 1) is arranged within the region where the variable resistance element film (19 in FIG. 1) of the variable resistance element (22 in FIG. 1) is in contact with the first wiring (5 in FIG. 1). However, in example 4, while arranged above the insulating barrier film 7, the region where the plug 9 is in contact with the second top electrode 11 of a variable resistance element 30 is arranged in a region different from the region where the variable resistance element film 9 of the variable resistance element 30 is in contact with the first wiring 5 (the regions do not overlap with each other). The variable resistance element film 9 is in direct contact with the first wiring 5 at the opening in the insulating barrier film 7 and is extended to the sides of the opening on the insulating barrier film 7. The top electrodes 10 and 11 and the variable resistance element film 9 are formed in an identical region. The planar second top electrode 11 formed above the insulating barrier film 7 is connected to the plug 19.

A method of manufacturing the semiconductor device according to example 4 is identical to that according to example 1, except that remaining regions of the hard mask film (12 in FIG. 5A), the second top electrode (11 in FIG. 5A), the first top electrode (10 in FIG. 5A), and the variable resistance element film (9 in FIG. 5A) are changed by using the hard mask film (13 in FIG. 4C) as a mask and carrying out dry etching in step A11 of example 1.

According to example 4, since connection of the plug 19 can be achieved on the planar second top electrode 11, generation of a void at the bottom of the plug 19 can be suppressed. In addition, for example, even when the plug 19 has a larger diameter at the bottom thereof, sufficient switching characteristics can be obtained.

Example 5

Figure 13:
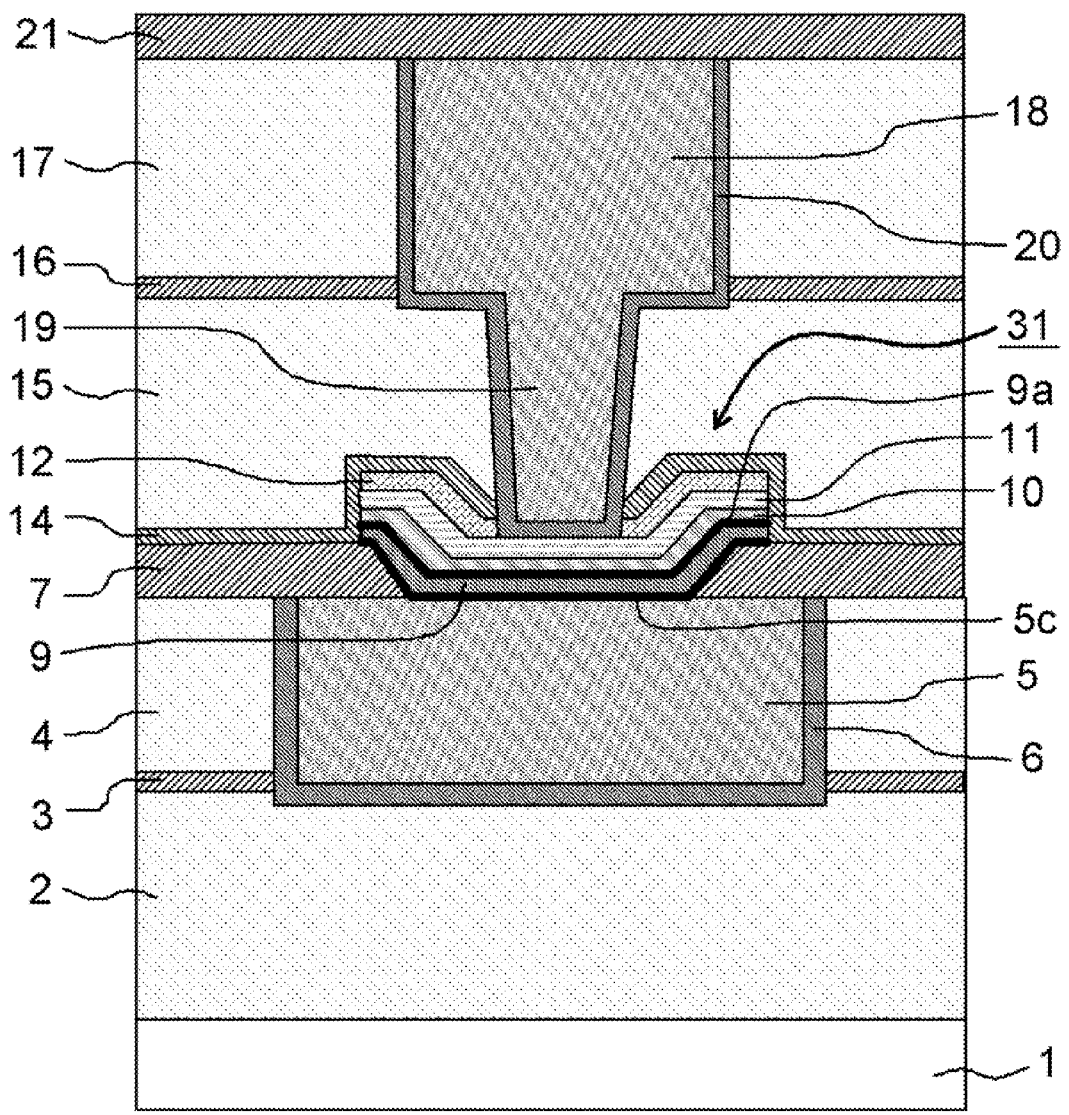
FIG. 13 is a partial cross-sectional view schematically illustrating a configuration of a semiconductor device according to example 5 of the present invention.

A semiconductor device according to example 5 of the present invention will be described with reference to the drawings. FIG. 13 is a partial cross-sectional view schematically illustrating a configuration of a semiconductor device according to example 5 of the present invention.

In example 1 (see FIG. 1), the bottom of the variable resistance element film (9 in FIG. 1) is in direct contact with the first wiring (5 in FIG. 1) and the top of the variable resistance element film (9 in FIG. 1) is in direct contact with the first top electrode (10 in FIG. 1). However, in example 5, the bottom of the variable resistance element film 9 is electrically connected to the first wiring 5 via a TaN/Ru multilayer bottom electrode 5c. Further, the top of the variable resistance element film 9 is electrically connected to the first top electrode 10 via a top variable resistance element film 9a. Other configurations are the same as those according to example 1.

The TaN/Ru multilayer bottom electrode 5c is an electrode film arranged between the first wiring 5 and the variable resistance element film 9 in a variable resistance element 31. The TaN/Ru multilayer bottom electrode 5c is made by stacking TaN (lower portion)/Ru (upper portion). If resistance change characteristics of the variable resistance element film 9 do not require copper and ON/OFF switching is realized by using a filament formed in an oxide layer, the variable resistance element film 9 and the first wiring 5 need to be isolated by a material having copper barrier properties. Thus, in view of diffusion barrier properties for the metal (copper, for example) of the first wiring 5 (bottom electrode) and switching characteristics of the variable resistance element 31, the TaN/Ru multilayer bottom electrode 5c is arranged between the variable resistance element film 9 and the first wiring 5. The TaN prevents diffusion of copper into the variable resistance element. Further, due to its small oxidation free energy, Ru is advantageous in the switching characteristics.

A top variable resistance element film 9a is a variable resistance element film arranged on the top of the variable resistance element film 9. The top variable resistance element film 9a is made of a metal oxide having a larger absolute value in free energy of oxidation than that of the metal component (tantalum, for example) of the variable resistance element film 9 ($Ta_2O_5$, for example). For example, a transition metal oxide of Ti or Ni etc. can be used as the top variable resistance element film 9a. For example, a TiO film having a film thickness of 3 nm formed by using a sputtering method can be used as the top variable resistance element film 9a. In this case, the first top electrode 10 can be made of Ru and the second top electrode 11 can be made of Ta. By forming conductive paths in the oxide of the top variable resistance element film 9a by application of a voltage or a current, ON/OFF (switching) control can be carried out. Alternatively, the positions of the top variable resistance element film 9a and the variable resistance element film 9 may be exchanged. Still alternatively, the variable resistance element film 9 may be omitted. Namely, only the top variable resistance element film 9a may be used.

A method of manufacturing the semiconductor device according to example 5 is identical to that according to example 1, except that the TaN/Ru multilayer bottom electrode 5c and the variable resistance element film 9 are formed in this order on the insulating barrier film 7 including the first wiring 5 in step A7 (see FIG. 3C) of example 1, the top variable resistance element film 9a, the first top electrode 10, and the second top electrode 11 are formed in this order on the variable resistance element film 9 in step A8 (see FIG. 4A), and the hard mask film 12, the second top electrode 11, the first top electrode 10, the top variable resistance element film 9a, the variable resistance element film 9, and the TaN/Ru multilayer bottom electrode 5c are continuously dry-etched by using the hard mask film (13 in FIG. 4C) as a mask in step A11 (see FIG. 5A).

According to example 5, meritorious effects identical to those of example 1 can be provided. In addition, example 5 can be applied to cases where resistance change characteristics of the variable resistance element film 9 do not require copper and ON/OFF switching is realized by using a filament formed in a transition metal layer.

Example 6

Figure 14:
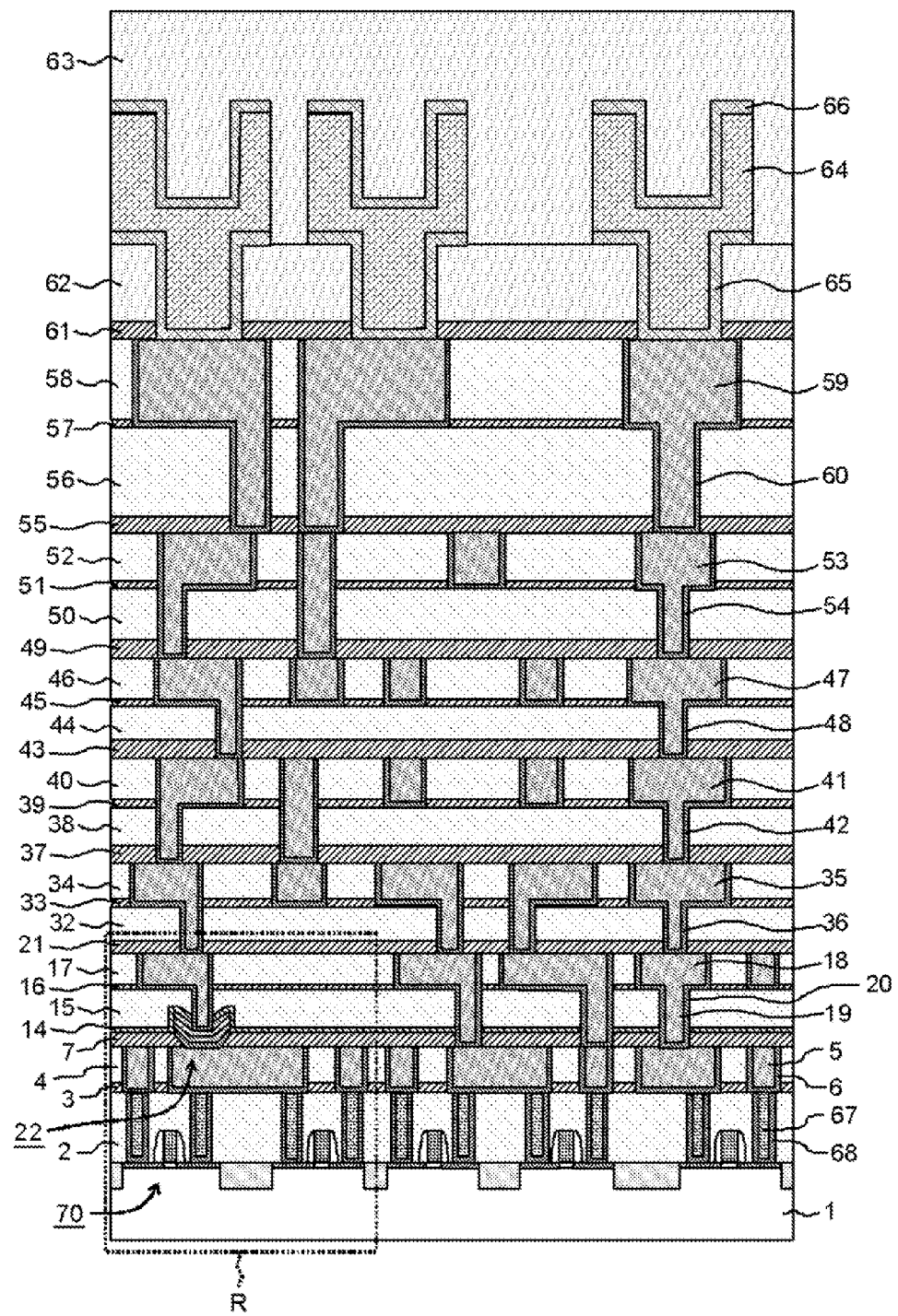
FIG. 14 is a partial cross-sectional view schematically illustrating a configuration of a semiconductor device according to example 6 of the present invention.
Figure 15:
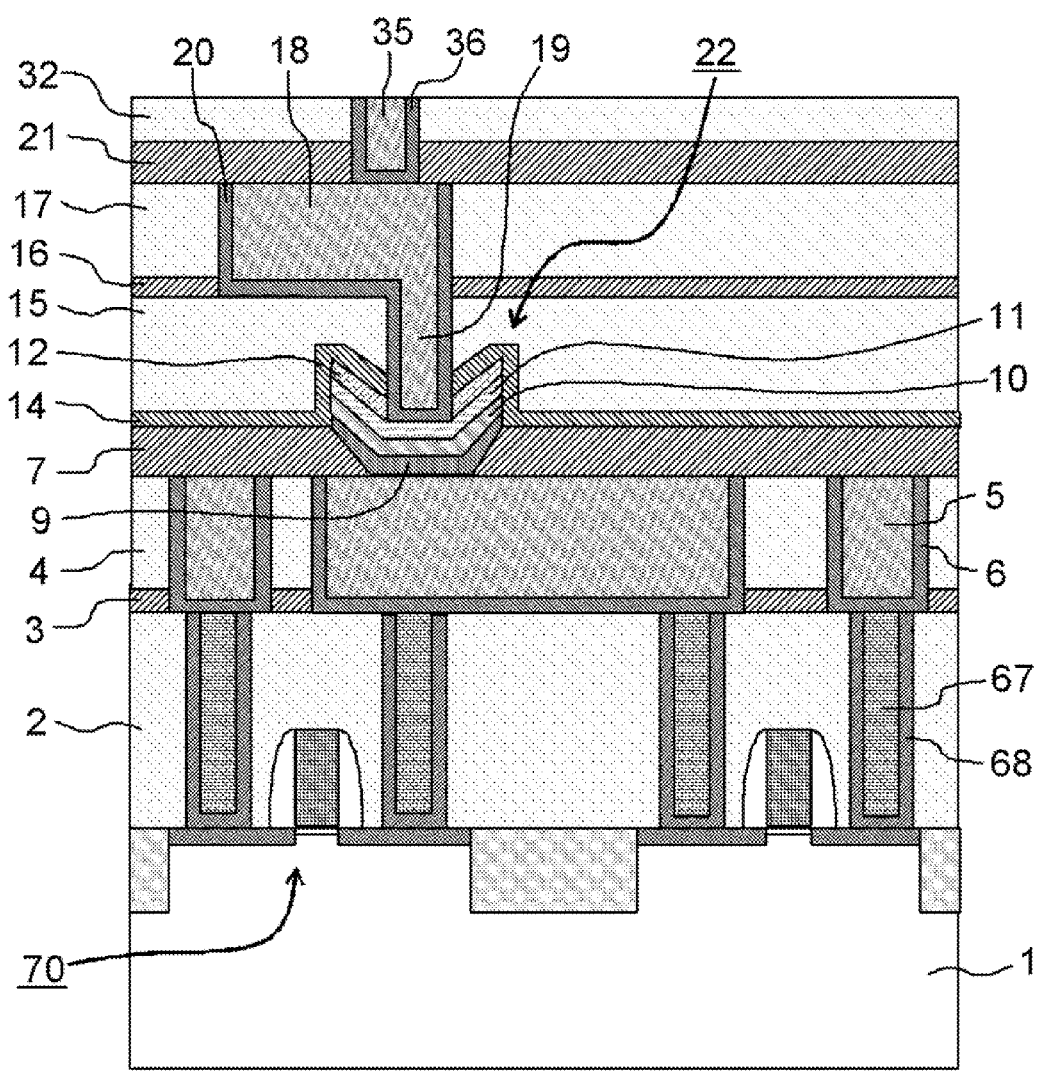
FIG. 15 is an enlarged sectional view of a region R in FIG. 14 schematically illustrating a configuration of the semiconductor device according to example 6 of the present invention.
Figure 16:
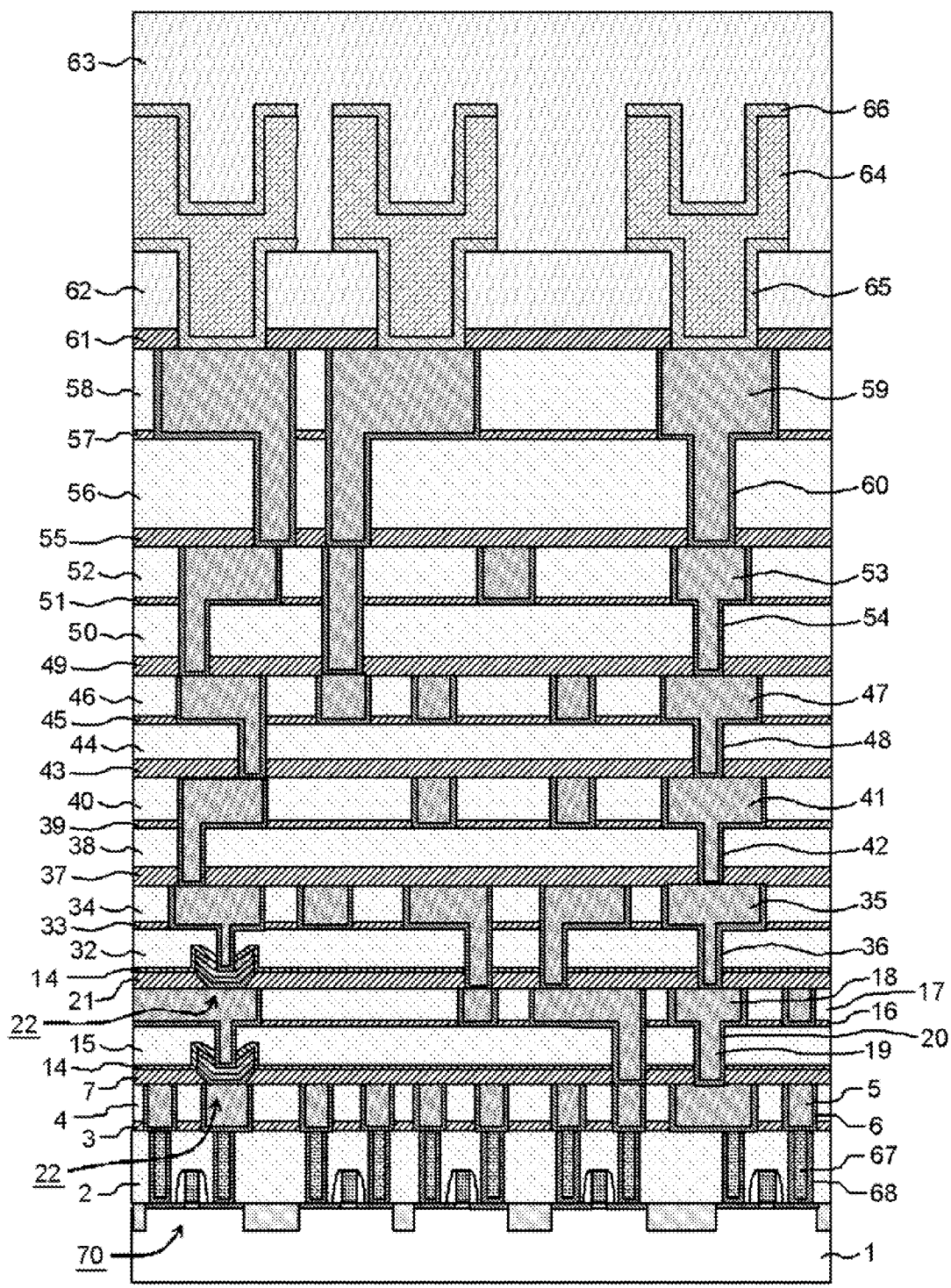
FIG. 16 is a partial cross-sectional view schematically illustrating a variation of a configuration of the semiconductor device according to example 6 of the present invention.

A semiconductor device according to example 6 of the present invention will be described with reference to the drawings. FIG. 14 is a partial cross-sectional view schematically illustrating a configuration of a semiconductor device according to example 6 of the present invention. FIG. 15 is an enlarged sectional view of a region marked R in FIG. 14 schematically illustrating a configuration of the semiconductor device according to example 6 of the present invention. FIG. 16 is a partial cross-sectional view schematically illustrating a variation of a configuration of the semiconductor device according to example 6 of the present invention.

In example 6, a select transistor 70 (MOSFET) is formed as a semiconductor element on the semiconductor substrate 1. A multilevel wiring layer structure (2 to 8, 14 to 21, and 32 to 68) is formed on the semiconductor substrate 1 including the select transistor 70, and the variable resistance element 22 identical to that of example 1 is incorporated in the multilevel wiring layer structure (2 to 7, 14 to 21, and 32 to 68). Configurations around the variable resistance element 22 are identical to those according to example 1.

The multilevel wiring layer structure (2 to 7, 14 to 21, and 32 to 68) has an insulating multilayer (laminate) body formed by stacking the interlayer insulating film 2, the barrier insulating film 3, the interlayer insulating film 4, the insulating barrier film 7, the protective insulating film 14, the interlayer insulating film 15, the etching stopper film 16, the interlayer insulating film 17, the barrier insulating film 21, an interlayer insulating film 32, an etching stopper film 33, an interlayer insulating film 34, a barrier insulating film 37, an interlayer insulating film 38, an etching stopper film 39, an interlayer insulating film 40, a barrier insulating film 43, an interlayer insulating film 44, an etching stopper film 45, an interlayer insulating film 46, a barrier insulating film 49, an interlayer insulating film 50, an etching stopper film 51, an interlayer insulating film 52, a barrier insulating film 55, an interlayer insulating film 56, an etching stopper film 57, an interlayer insulating film 58, a barrier insulating film 61, an interlayer insulating film 62, and a protective insulating film 63 in this order on the semiconductor substrate 1.

The multilevel wiring layer structure includes plugs 67 each embedded in a prepared hole formed in the interlayer insulating film 2 via a barrier metal 68. The multilevel wiring layer structure includes first wirings 5 each embedded via a barrier metal 6 in a wiring trench formed in the interlayer insulating film 4 and the barrier insulating film 3. The multilevel wiring layer structure includes: second wirings 18 each embedded in a wiring trench formed in the etching stopper film 16 and the interlayer insulating film 17; and plugs 19' each embedded in a prepared hole formed in the interlayer insulating film 15, the protective insulating film 14, and the hard mask film 12. Each of the second wirings 18 is integrated with a corresponding plug 19', and the side and bottom surfaces of the second wirings and the plugs 19' are covered by a barrier metal 20. The multilevel wiring layer structure includes wirings 35 each embedded via a barrier metal 36 in a prepared hole formed in the interlayer insulating film 32 and the barrier insulating film 21 and in a wiring trench formed in the interlayer insulating film 34 and the etching stopper film 33. The multilevel wiring layer structure includes wirings 41 each embedded via a barrier metal 42 in a prepared hole formed in the interlayer insulating film 38 and the barrier insulating film 37 and in a wiring trench formed in the interlayer insulating film 40 and the etching stopper film 39. The multilevel wiring layer structure includes wirings 47 each embedded via a barrier metal 48 in a prepared hole formed in the interlayer insulating film 44 and the barrier insulating film 43 and in a wiring trench formed in the interlayer insulating film 46 and the etching stopper film 45. The multilevel wiring layer structure includes wirings 53 each embedded via a barrier metal 54 in a prepared hole formed in the interlayer insulating film 50 and the barrier insulating film 49 and in a wiring trench formed in the interlayer insulating film 52 and the etching stopper film 51. The multilevel wiring layer structure includes wirings 59 each embedded via a barrier metal 60 in a prepared hole formed in the interlayer insulating film 56 and the barrier insulating film 55 and in a wiring trench formed in the interlayer insulating film 58 and the etching stopper film 57. The multilevel wiring layer structure includes wirings 64 each embedded via a barrier metal 65 in a prepared hole formed in the interlayer insulating film 62 and the barrier insulating film 61. Barrier metals 66 are formed on the respective wirings 64, and the protective insulating film 63 is formed on the barrier metals 66, the wirings 64, and the interlayer insulating film 62 including the barrier metals 65.

Source/drain electrodes of the select transistor 70 are electrically connected to a topmost wiring 64 via a corresponding plug 67, first wiring 5, plug 19', second wiring 18, and wirings 35, 41, 47, 53, and 59.

The insulating barrier film 7 has openings on the first wiring 5. The insulating barrier film 7 has an opening whose wall surface is a tapered surface. The opening has a wider diameter at a portion farther from the first wiring 5. The tapered surface of the opening in the insulating barrier film 7 is set to be 85 degrees or less with respect to the top surface of the first wiring 5.

The multilevel wiring layer structure includes the variable resistance element 22 in the opening in the insulating barrier film 7 and on the first wiring 5 serving as a bottom electrode. The variable resistance element 22 is a multilayer (laminate) body in which the variable resistance element film 9, the first top electrode 10, and the second top electrode 11 are stacked in this order. A hard mask film is formed on the second top electrode 11, and a multilayer (laminate) body formed by the variable resistance element film 9, the first top electrode 10, the second top electrode 11, and the hard mask film 12 has top and side surfaces covered by the protective insulating film 14.

The variable resistance element 22 includes the variable resistance element film 9 between the first wiring 5 serving as a bottom electrode and a pair of the top electrodes 10 and 11 electrically connected to the second wiring 18 via the plug 19. The variable resistance element film 9 is formed on the first wiring 5, on the tapered surface of the opening in the insulating barrier film 7, and on the insulating barrier film 7. Based on the variable resistance element 22, the variable resistance element film 9 and the first wiring 5 are in direct contact with each other at the opening formed in the insulating barrier film 7, and the plug 19 and the second top electrode 11 are connected to each other via the barrier metal 20. The plug 19 is embedded via the barrier metal 20 in a prepared hole formed in the interlayer insulating film 15, the protective insulating film 14, and the hard mask film 12.

Copper can be used for the wirings (including the plugs such as 5, 18, 19, 19', 35, 41, 47, 53, and 59). Al (aluminum) can be used for the topmost wirings 64. Tungsten can be used for the plugs 67. A Ta/TaN multilayer (laminate) body can be used for each of the barrier metals (6, 20, 36, 42, 48, 54, and 60). A Ti/TiN multilayer (laminate) body can be used for the barrier metals 65 and 66. TiN can be used for the barrier metal 68. A SiOCH film having a dielectric constant 3 or less can be used for each of the interlayer insulating films (2, 4, 15, 17, 32, 34, 38, 40, 44, 46, 50, 52, 56, and 58). A silicon oxide film can be used for the interlayer insulating film 62. A silicon oxynitride can be used for the protective insulating film 63. SiN can be used for the insulating barrier film 7 on the first wiring 5, and a SiCN film having a low dielectric constant can be used for the insulating barrier films (including the barrier insulating films and the etching stopper films such as 3, 16, 21, 33, 37, 43, 49, 55, and 61) other than the insulating barrier film 7.

With respect to the variable resistance element 22, copper can be used for the first wiring 19 serving as a bottom electrode, TaSiO for the variable resistance element film 9, and Ru for the first top electrode 10. Further, TaN can be used for the second top electrode 11, a SiN film for the hard mask film 12 on the second top electrode 11, and a SiN film formed by high-density plasma CVD for the protective insulating film 14 covering the variable resistance element 22 including the hard mask film 12.

Regarding a method of manufacturing the semiconductor device according to example 6, the periphery of the variable resistance element 22 can be manufactured in the same way as in example 1. The other portions can be manufactured by a general method known in the art.

In example 6, the variable resistance element 22 has the same configuration as that used in the semiconductor device according to example 1. However, the present invention is not limited to such example. The variable resistance element may have the same configuration as that used in the semiconductor device according to any one of examples 2 to 5.

Further, in example 6, a single variable resistance element 22 is formed in one layer inside the multilevel wiring layer structure. However, as illustrated in FIG. 16, a plurality of variable resistance elements 22 and 22' can be formed in a plurality of layers inside the multilevel wiring layer structure in the vertical direction. In FIG. 16, the variable resistance element 22' has a bottom electrode electrically connected to the second wiring 18 and has a top electrode electrically connected to the plug of the wiring 35. The second wiring 18 also serves as a bottom electrode of the variable resistance element 22'. A plurality of variable resistance elements may be formed not only in different layers but also in a single layer. In most-advanced ULSI, copper wirings of 5 layers or more are often used to connect transistors. There are cases where 10 or more wiring layers are used. According to the present invention, a variable resistance element can be formed on the top of a wiring in any layer through a small number of processing steps. Thus, as illustrated in FIG. 16, the plurality of variable resistance elements 22 and 22' can be formed. Such multilayer (laminate) structure is not only effective as the above FPGA switching element but also as a memory element structure realizing a large-scale memory amount.

According to example 6, meritorious effects identical to those of example 1 can be provided. In addition, by simultaneously forming the plug (19 in FIG. 15) on the variable resistance element 22 and the plugs (19' in FIG. 14) in the same layer and farther away from the variable resistance element 22, processing can be simplified. In addition, by adopting example 6, variable resistance elements can be loaded inside a most-advanced ULSI logic.

Example 7

Figure 17:
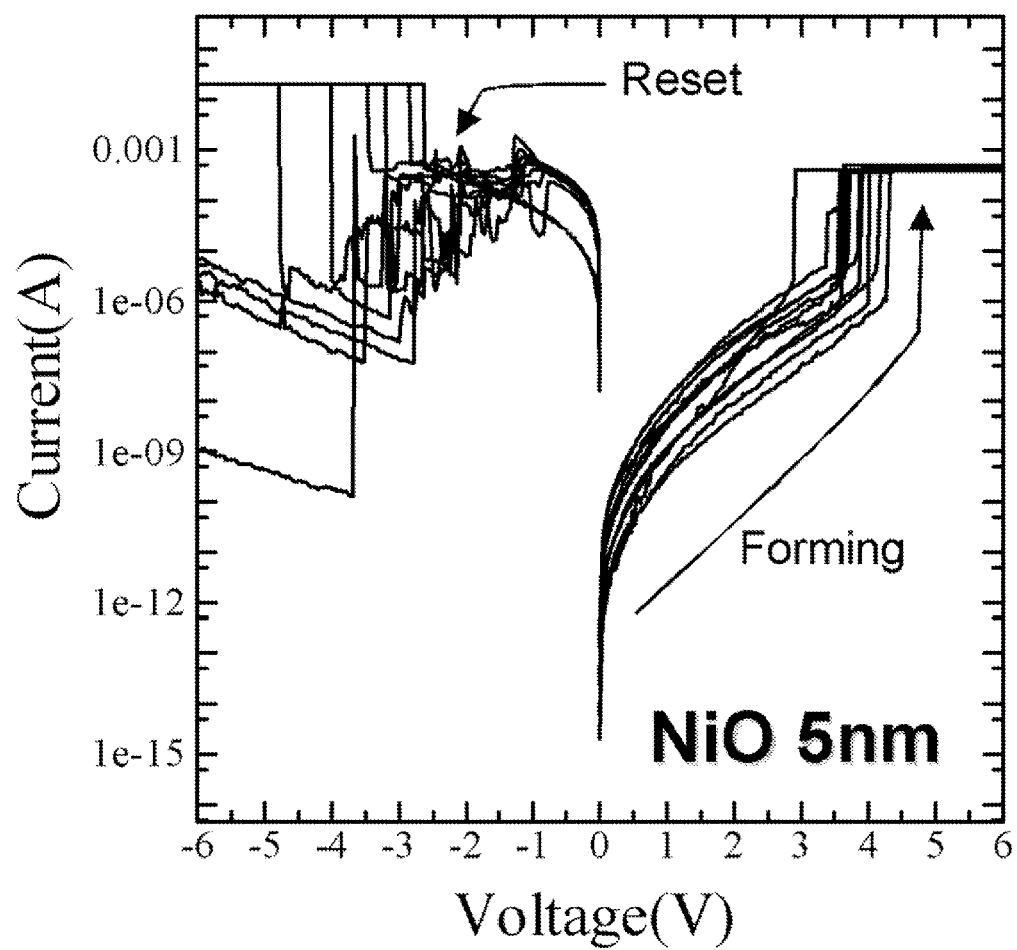
FIG. 17 illustrates resistance change characteristics of a variable resistance element in a semiconductor device according to example 7 of the present invention.

A semiconductor device according to example 7 of the present invention will be described with reference to the drawings. FIG. 17 illustrates resistance change characteristics of a variable resistance element in a semiconductor device according to example 7 of the present invention.

In example 7, the configuration according to example 5 (see FIG. 13) was used, in which the TaN/Ru multilayer bottom electrode 5c was formed to have a film thickness of 5 nm and a NiO film used as the variable resistance element film 9 was formed to have a film thickness of 5 nm. The NiO film can be formed by a reactive sputtering method in which Ni is used as a target on the substrate heated to 300° C. In addition, the first top electrode 10 made of Ru was formed to have a film thickness of 10 nm, and the second top electrode 11 made of Ta was formed to have a film thickness of 50 nm. Both of the electrodes 10 and 11 can be formed by using DC sputtering. Namely, based on the configuration where the lower-layer first wiring 5 (copper wiring) also serves as a bottom electrode, TaN, Ru, NiO, and Ru are stacked in this order from the bottom to top on the first wiring 5.

FIG. 17 illustrates resistance change characteristics of a variable resistance element having the configuration according to example 7. It was confirmed that application of a voltage of 4 V causes transition to a low resistance state (ON state) and application of a voltage of −3 V causes transition to a high resistance state. While the above operation was a so-called bipolar operation, it was also confirmed that resistance change characteristics were exhibited when a unipolar voltage was applied (unipolar operation).

The present invention is applicable to any case where a low-resistance and highly-reliable variable resistance element is formed in a multilayer copper wiring. The present invention is not limited whatsoever in the applicability thereof. Further, the present invention is not limited by the configuration of the variable resistance element. For example, the variable resistance element may be formed by a multilayer (laminate) structure of other films. Features of the present invention include causing a copper wiring to serve as or integrate with a bottom electrode of the variable resistance element and connecting a top surface of the variable resistance element to a copper plug.

The present invention has thus been described by means of several preferred examples. However, it is to be understood that these exemplary embodiments and examples are for illustrative purposes only and are not intended to limit the scope of the present invention.

For example, while a technique of a manufacture apparatus of a semiconductor device including a CMOS circuit, which is an application field of the invention made by the present inventors, has been described in detail and examples where a variable resistance element is formed on the top of a copper wiring on a semiconductor substrate have been described, the present invention is not limited to these examples. For example, the present invention is also applicable to: a semiconductor product including a memory circuit such as a DRAM (Dynamic Random Access Memory), an SRAM (Static Random Access Memory), a flash memory, an FRAM (Ferro Electric Random Access Memory), an MRAM (Magnetic Random Access Memory), a variable-resistance-type memory, or a bipolar transistor; a semiconductor product including a logic circuit such as a microprocessor; or a copper wiring of a board or a package on which two or more of the above devices are mounted together. In addition, the present invention is also applicable to bonding of an electronic circuit device, an optical circuit device, a quantum circuit device, a micromachine, or MEMS (Micro Electro Mechanical Systems) to a semiconductor device, for example. In addition, in the present invention, while the examples have been described with an emphasis on switching function, the present invention can also be used for a memory element using both nonvolatility and resistance change characteristics, for example.

In addition, the substrate bonding method according to the present invention can also be checked based on a completed product. Specifically, first, by observing a cross section of a device with a TEM (Transmission Electron Microscope), whether a copper wiring is used in a multilayer wiring is checked. If a variable resistance element is mounted, by observing whether the copper wiring is on the bottom surface of the variable resistance element and also serves as a bottom electrode, use of a configuration disclosed by the present invention can be checked. The configuration can also be checked by observing whether a copper plug is directly connected to a top electrode. In addition to TEM, by carrying out a composition analysis such as EDX (Energy Dispersive X-ray Spectroscopy) or EELS (Electron Energy-Loss Spectroscopy), materials used can be identified. Similarly, by carrying out a composition analysis, whether an insulating barrier film on the copper wiring is made of a material identical to that of a protective film of the variable resistance element can be determined.

It will be obvious to those skilled in the art upon reading the present description that various changes and substitutions may be made easily by equivalent components and techniques. However, it is evident that such changes and substitutions lie within the true scope and spirit of the appended claims. Modifications and adjustments of the exemplary embodiments and examples are possible within the scope of the overall disclosure (including claims) of the present invention and based on the basic technical concept of the invention. Various combinations and selections of various disclosed elements are possible within the scope of the claims of the present invention. That is, the present invention of course includes various variations and modifications that could be made by those skilled in the art according to the overall disclosure including the claims and the technical concept.

What is claimed is:

1. A semiconductor device comprising:
   a semiconductor substrate;
   a multilevel wiring layer structure on the semiconductor substrate; and
   a variable resistance element in the multilevel wiring layer structure;
   wherein the variable resistance element comprises a variable resistance element film disposed between a top electrode and a bottom electrode;
   wherein the variable resistance element film comprises a film whose resistance changes based on actions of a metal of the bottom electrode;
   wherein the multilevel wiring layer structure comprises at least a wiring electrically connected to the bottom electrode and a plug electrically connected to the top electrode;
   wherein said wiring also serves as the bottom electrode;
   wherein an insulating barrier film is in contact with the bottom electrode and the variable resistance element film in a portion arranged between the bottom electrode and the variable resistance element film;
   wherein the insulating barrier film has an opening;
   wherein the variable resistance element film is in contact with the bottom electrode in the opening;
   wherein the variable resistance element film is an oxide including Ta or TaSi; and
   wherein the variable resistance element film has a laminate structure in which $Ta_2O_5$ and TaSiO are stacked in this order from bottom to top.

2. The semiconductor device according to claim 1,
   wherein the variable resistance element film has a bottom surface at a periphery of a connection portion between the wiring and the variable resistance element film; and
   wherein the bottom surface is set at an angle of 85 degrees or less with respect to a top surface of said wiring.

3. The semiconductor device according to claim 1,
   wherein the opening has a tapered wall surface and has a wider diameter at a portion farther from said wiring;
   wherein the tapered surface is set at an angle of 85 degrees or less with respect to a top surface of the wiring; and
   wherein the variable resistance element film is arranged so that a periphery of a connection portion between said wiring and the variable resistance element film is at least arranged on the tapered surface.

4. The semiconductor device according to claim 1, wherein an area of a region where the plug and the top electrode are connected is smaller than an area of a region where the variable resistance element film and said wiring are connected.

5. The semiconductor device according to claim 1, wherein a region where the plug and the top electrode are connected is arranged in a region different from a region where the variable resistance element film and said wiring are connected.

6. The semiconductor device according to claim 1, wherein said wiring is made of copper.

7. The semiconductor device according to claim 6, wherein said wiring is alloyed with Al or a surface of said wiring is converted into silicide or nitride.

8. The semiconductor device according to claim 1,
   wherein the top electrode has a structure in which a first top electrode and a second top electrode are stacked in this order on the variable resistance element film;
   wherein the first top electrode comprises a metal material having a smaller absolute value in oxidation free energy than that of a metal component of the variable resistance element film; and
   wherein the second top electrode is in contact with the plug.

9. The semiconductor device according to claim 8, wherein the first top electrode is made of Pt, Ru, or oxide thereof.

10. The semiconductor device according to claim 8, wherein the second top electrode is made of Ti, Ta, W, or nitride thereof.

11. The semiconductor device according to claim 1, comprising a second bottom electrode arranged between the wiring and the variable resistance element film and having diffusion barrier properties for a metal of said wiring.

12. The semiconductor device according to claim 11,
   wherein the second bottom electrode is an electrode having a laminate structure of two layers; and
   wherein one of the layers that is on the variable resistance element film is made of a material identical to that of the first top electrode.

13. The semiconductor device according to claim 11, wherein the second bottom electrode is an electrode in which TaN and Ru are stacked in this order on said wiring.

14. The semiconductor device according to claim 11, comprising a second variable resistance element film arranged between the variable resistance element film and the top electrode and made of a metal oxide having a larger absolute value in oxidation free energy than that of a metal component of the variable resistance element film.

15. The semiconductor device according to claim 14, wherein the second variable resistance element film is made of oxide of Ti or Ni.

16. The semiconductor device according to claim 3,
   wherein a hard mask film is arranged on the top electrode;
   wherein a laminate body of the hard mask film, the top electrode, and the variable resistance element film has top and side surfaces covered by a protective insulating film;
   wherein the protective insulating film is in contact with the insulating barrier film at a periphery of the laminate body of the hard mask film, the top electrode, and the variable resistance element film; and
   wherein the plug extends in a prepared hole formed in the protective insulating film and the hard mask film and is electrically connected to the top electrode.

17. The semiconductor device according to claim 3,
wherein a hard mask film is arranged on the top electrode;
wherein a second hard mask film made of a material different from that of the hard mask film is arranged on the hard mask film;
wherein a laminate body of the second hard mask film, the hard mask film, the top electrode, and the variable resistance element film has a side surface covered by a protective insulating film;
wherein the protective insulating film is in contact with the insulating barrier film at a periphery of the laminate body of the second hard mask film, the hard mask film, the top electrode, and the variable resistance element film; and
wherein the plug extends in a prepared hole formed in the second hard mask film and the hard mask film and is electrically connected to the top electrode.

18. The semiconductor device according to claim 17,
wherein a laminate body of the second hard mask film, the hard mask film, the top electrode, and the variable resistance element film has top and side surfaces covered by a protective insulating film;
wherein the protective insulating film is in contact with the insulating barrier film at a periphery of the laminate body of the second hard mask film, the hard mask film, the top electrode, and the variable resistance element film; and
wherein the plug extends in a prepared hole formed in the protective insulating film, the second hard mask film, and the hard mask film and is electrically connected to the top electrode via a barrier metal.

19. The semiconductor device according to claim 16, wherein the protective insulating film is made of a material identical to that of the hard mask film and the insulating barrier film.

20. The semiconductor device according to claim 1, comprising a second variable resistance element that is formed in a layer identical to or different from that of the variable resistance element in the multilevel wiring layer structure and that comprises a variable resistance element film whose resistance changes between a top electrode and a bottom electrode.

21. The semiconductor device according to claim 20,
wherein the multilevel wiring layer structure comprises at least a second wiring electrically connected to the bottom electrode of the second variable resistance element and a second plug electrically connected to the top electrode of the second variable resistance element; and
wherein the second wiring also serves as the bottom electrode of the second variable resistance element.

22. The semiconductor device according to claim 21, wherein the second wiring is integrated with the plug.

23. The semiconductor device according to claim 1,
wherein the variable resistance element film is in contact with the insulating barrier film at a periphery of the opening.

24. The semiconductor device according to claim 1,
wherein the plug is integral with another wiring in an upper portion of the plug.

25. The semiconductor device according to claim 1,
wherein the plug and another wiring in an upper portion of the plug are formed in interlayer insulating films.

26. The semiconductor device according to claim 1,
wherein the variable resistance element film is an ion conductive layer.

* * * * *